(12) United States Patent
Hongo

(10) Patent No.: US 7,986,183 B2
(45) Date of Patent: Jul. 26, 2011

(54) AMPLIFYING CIRCUIT AND AMPLIFYING METHOD

(75) Inventor: Hironobu Hongo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/727,541

(22) Filed: Mar. 19, 2010

(65) Prior Publication Data

US 2010/0264992 A1    Oct. 21, 2010

(30) Foreign Application Priority Data

Apr. 20, 2009    (JP) .................................. 2009-102114

(51) Int. Cl.
*H03F 3/00*    (2006.01)
(52) U.S. Cl. .......................................... 330/11; 330/297
(58) Field of Classification Search .................... 330/11, 330/297; 327/172
See application file for complete search history.

(56) References Cited

U.S. PATENT DOCUMENTS

| 4,812,987 | A | * | 3/1989 | Yamawaki et al. ........... 708/300 |
| 5,229,721 | A |   | 7/1993 | Stade |
| 5,282,223 | A | * | 1/1994 | Muramatsu .................... 375/214 |
| 6,255,898 | B1 | * | 7/2001 | Ono et al. ....................... 327/551 |
| 7,408,403 | B2 | * | 8/2008 | Farrar et al. ..................... 330/10 |
| 7,482,869 | B2 | * | 1/2009 | Wilson ........................... 330/199 |
| 7,675,361 | B2 | * | 3/2010 | Guo et al. ...................... 330/251 |
| 7,696,818 | B2 | * | 4/2010 | Kunihiro et al. ................ 330/10 |

FOREIGN PATENT DOCUMENTS

| JP | 6-21730 | 1/1994 |
| JP | 2002-043855 | 2/2002 |

* cited by examiner

*Primary Examiner* — Patricia Nguyen
(74) *Attorney, Agent, or Firm* — Katten Muchin Rosenman LLP

(57) ABSTRACT

An amplifying circuit includes: a waveform modifying unit which changes the signal value in the second section in such a manner so as to reduce the difference between the signal strength of a DC component of the input signal and the limit value that limits the variation range of the signal value in the first section; a DC component removing unit which removes the DC component of the input signal after the input signal has been modified by the waveform modifying unit; and an amplifying unit which amplifies the input signal whose DC component has been removed.

11 Claims, 23 Drawing Sheets

AMPLIFYING CIRCUIT AND AMPLIFYING METHOD

CROSS-REFERENCE TO RELATED APPLICATIONS

This application is based upon and claims the benefit of priority of the prior Japanese Patent Application No. 2009-102114, filed on Apr. 20, 2009, the entire contents of which are incorporated herein by reference.

FIELD

The embodiments discussed herein are related to an amplifying circuit for amplifying an input signal.

BACKGROUND

FIG. 1 is an explanatory diagram illustrating a configuration example of an amplifying circuit. The amplifying circuit includes an n-channel field-effect transistor (FET) 101 for amplifying an input signal supplied from a signal source 100. The input signal from the signal source 100 is first passed through a resistor R10 and then fed into a capacitor C10 where the DC component of the input signal is removed. The input signal whose DC component is thus removed, is then summed with a gate bias voltage, and the resulting signal is applied to the gate terminal of the FET 101. The gate bias voltage is supplied from a power supply line that supplies predetermined voltage $V_g$ via a resistor R11; this power supply line is grounded via a capacitor C11.

The drain terminal of the FET 101 is coupled via an inductor L10 to a power supply line that supplies voltage $V_d$. This power supply line is grounded via a capacitor C12. The amplified signal obtained by amplifying the input signal through the FET 101 is output from its drain terminal and applied via a DC component removing capacitor C13 to a load 102.

The gate voltage biasing method of the FET 101 includes a class of operation intended for power conservation, which is described as class B operation, class C operation, etc., according to the magnitude of the voltage applied to the gate. The biasing method further includes a class of operation described as class AB operation in which bias current flows even during a period when there is no input signal in order to avoid signal waveform distortion that occurs near the pinch-off voltage, though this operation increases power consumption compared with the above two classes.

There is proposed an amplifier substantially free from crossover distortion, which combines the low distortion characteristic of a class AB amplifier with the low power consumption characteristic of a class B amplifier. The proposed amplifier has a signal expansion characteristic for the purpose of reducing noise at no-signal or low-signal levels.

There is also proposed a power amplifier for high-frequency applications that is low in distortion and that can be reduced in size, in which a bipolar transistor amplifies an input signal containing a plurality of frequency components, and a difference frequency signal that the transistor produces in relation to the input signal is detected by a collector choke inductor that constitutes a difference frequency signal detecting means. Then, based on the level of the detected difference frequency signal, a bias control circuit controls a base voltage source to vary the bias point of the transistor. In this way, when amplifying a large-amplitude signal that can produce a distortion from the transistor, the distortion is suppressed by operating the amplifier in class A having good linearity, and when amplifying a small-amplitude signal that does not produce a distortion from the transistor, the amplifier is operated close to class B to enhance power efficiency.

Related art is disclosed in Japanese Unexamined Patent Publication No. H06-21730 and Japanese Unexamined Patent Publication No. 2002-43855.

SUMMARY

According to one embodiment, there is provided an amplifying circuit for amplifying a signal having a waveform that alternates repeatedly between a first section where a signal value varies within a variation range limited by at least one of upper and lower limit values and a second section that is a section other than the first section, including: a waveform modifying unit which changes the signal value in the second section in such a manner as to reduce the difference between the signal strength of a DC component of the input signal and the limit value that limits the variation range of the signal value in the first section; a DC component removing unit which removes the DC component of the input signal after the input signal has been modified by the waveform modifying unit; and an amplifying unit which amplifies the input signal whose DC component has been removed.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

As described previously, class B operation is intended for power conservation. The following is an example of signal waveform which can be inputted to a class B amplifier.

Figure 2:
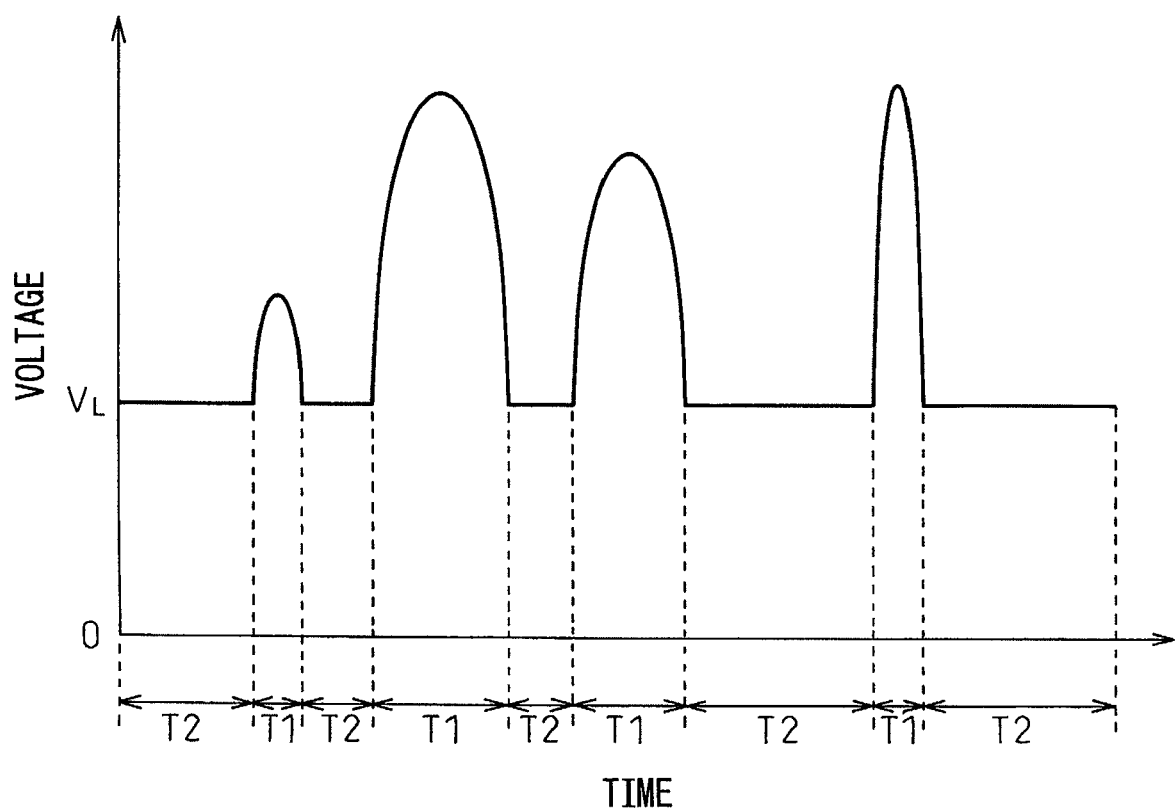
FIG. 2 is an explanatory diagram illustrating the waveform of a first example of an input signal.

FIG. 2 is an explanatory diagram illustrating the waveform of a first example of the input signal. The input signal waveform alternates repeatedly between a first section T1 where there is a waveform to be amplified and a second section T2 where there is not. In the first section T1, the signal value varies within a range limited by a lower limit value $V_L$. For example, in the input signal example illustrated in FIG. 2, the waveform has a shape similar to that of a half-wave, and during the second section T2, the signal remains unchanged with its signal value maintained substantially at the lower limit value $V_L$.

When amplifying the waveform having the above-described characteristic, since there is no signal waveform to be amplified in the second section T2, there is no need to amplify the portions of the waveform that lie in regions below the lower limit value $V_L$. Therefore, amplifier power consumption can be reduced by using a class B amplifier.

Figure 1:
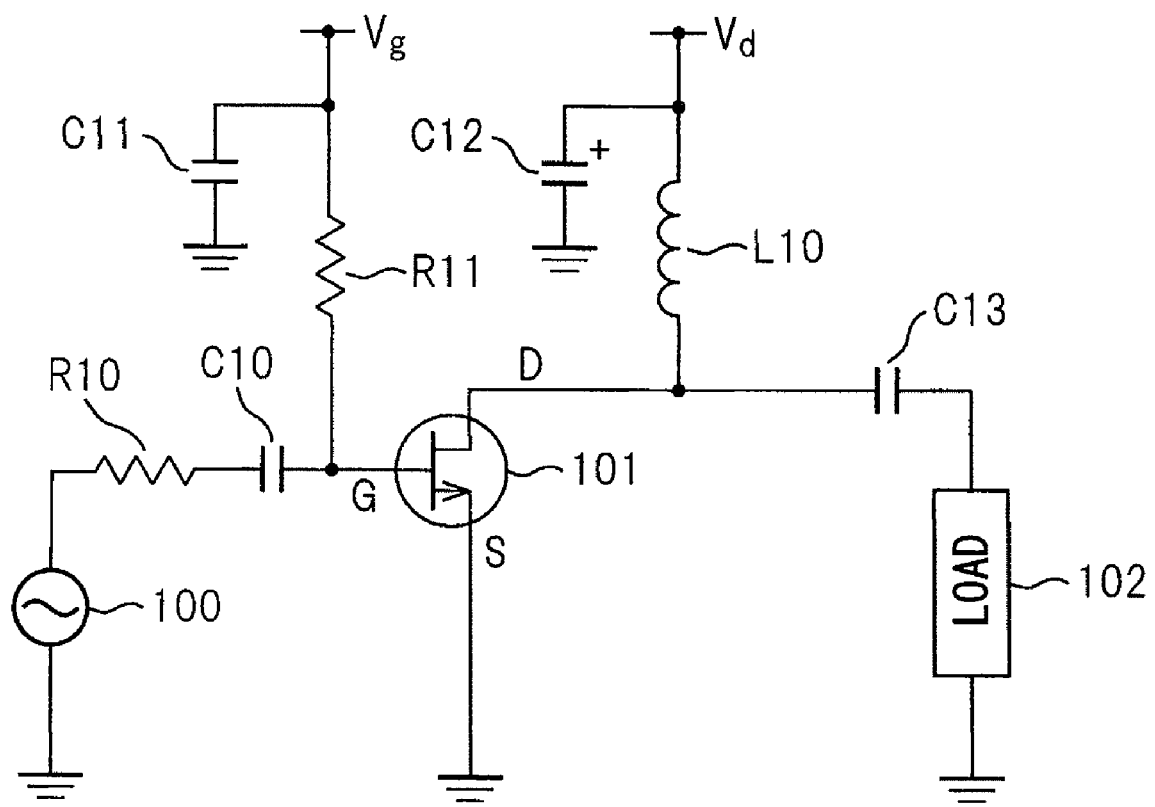
FIG. 1 is an explanatory diagram illustrating a configuration example of an amplifying circuit.
Figure 3:
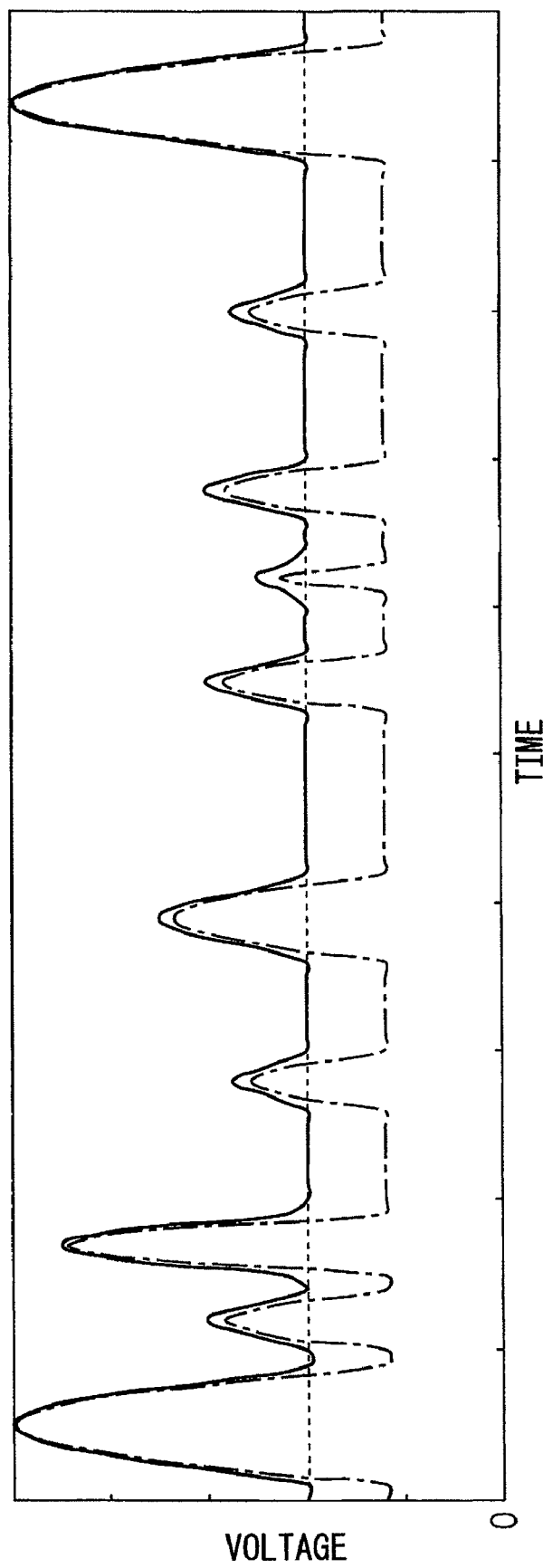
FIG. 3 is an explanatory diagram illustrating the shape of an output waveform when the waveform illustrated in FIG. 2 is amplified by a class B amplifying circuit.

Next, referring to FIG. 3, a description will be given of the shape of the output waveform produced when the waveform having the characteristic described above with reference to FIG. 2 is amplified by the amplifying circuit of FIG. 1 which is operated in class B. The semi-dashed line indicates the input signal waveform having the above-described characteristic. The dashed line indicates the DC level of the input signal. The solid line indicates the waveform of the signal output from the drain terminal of the FET 101.

When the gate bias voltage is added to the input signal passed through the DC component removing capacitor C10, the DC level of the input signal indicated by the dashed line becomes equal to the gate bias voltage. When the amplifying circuit is used as a class B amplifying circuit, since the gate bias voltage is set at or near the pinch-off voltage, the portions of the waveform that lie in regions where the voltage level is lower than the gate bias voltage are not amplified.

When the signal having the characteristic described above with reference to FIG. 2 is input to the class B amplifying circuit, the DC level of the input signal may become larger than the lower limit value $V_L$. For example, in the case of the waveform illustrated in FIG. 2, the signal value in the second section T2 remains substantially unchanged at the lower limit value $V_L$, so that the DC level of the input signal becomes larger than the lower limit value $V_L$. As a result, if the input signal is supplied to the class B amplifier after removing the DC component of the signal, the output waveform will have a shape such that the input waveform is sliced at the DC level. If a bipolar transistor is used instead of the FET 101, the output waveform will also have a shape such that the input waveform is sliced at the cutoff voltage.

The amplifier having the signal expansion characteristic described above is a full-wave push-pull amplifier. In the case of a full-wave amplifier, the center point of the voltage amplitude of the full-wave signal can be set as the bias point. However, when amplifying the signal waveform having the second section T2 illustrated in FIG. 2, it is not possible to determine the bias point in the same manner as in the full-wave amplifier. As a result, the amplifier having the signal expansion characteristic described above has a problem handling a signal with a waveform such as depicted in FIG. 2.

Figure 4:
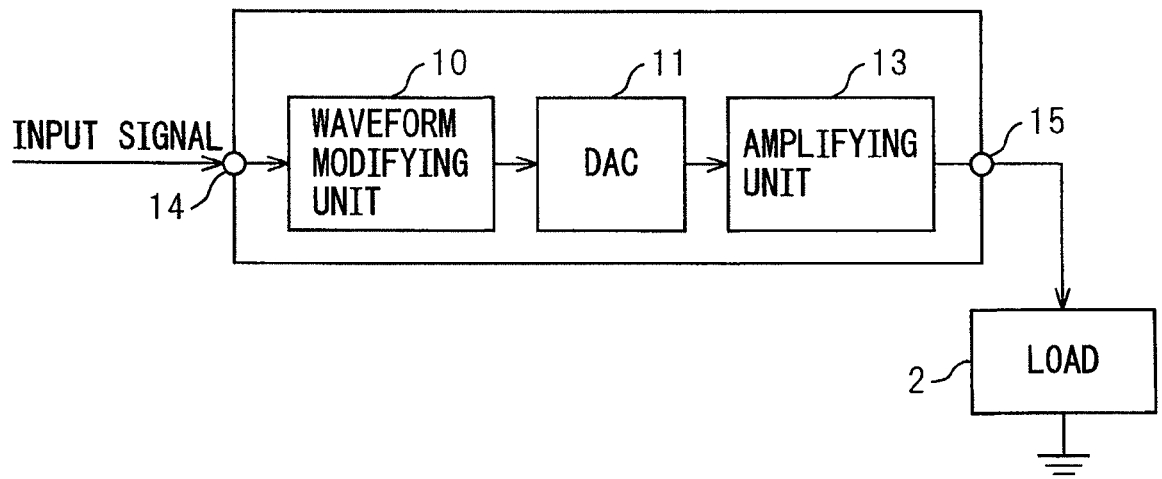
FIG. 4 is an explanatory diagram illustrating a configuration example of an amplifying circuit according to the present disclosure.

An embodiment will be explained with reference to accompanying drawings. FIG. 4 is an explanatory diagram illustrating a configuration example of an amplifying circuit according to the present disclosure. Reference numeral 1 represents the amplifying circuit, and reference numeral 2 indicates a load; further, reference numeral 10 indicates a waveform modifying unit, and 11 indicates a digital-analog converter (DAC). Reference numeral 13 indicates an amplifying unit. Reference numeral 14 indicates an input line via which an input signal is applied to the amplifying circuit 1, and 15 indicates an output line via which an amplified signal produced by amplifying the input signal is output from the amplifying circuit 1 to the load 2.

In the amplifying circuit 1, the input signal in digital form is first converted into an analog signal which is then amplified by a predetermined voltage gain A, and the amplified signal produced by thus amplifying the input signal is applied to the load 2. The signal having the characteristic earlier described with reference to FIG. 2 is input to the amplifying circuit 1, and the amplifying circuit 1 is used to amplify such an input signal.

The waveform modifying unit 10, the DAC 11, and the amplifying unit 13 together constitute the amplifying circuit 1. The waveform modifying unit 10 modifies the waveform of the input signal by changing the signal value in the second section T2 depicted in FIG. 2. The waveform modification performed by the waveform modifying unit 10 will be described in detail later. The DAC 11 converts the input signal into an analog signal for input to the amplifying unit 13.

Figure 5:
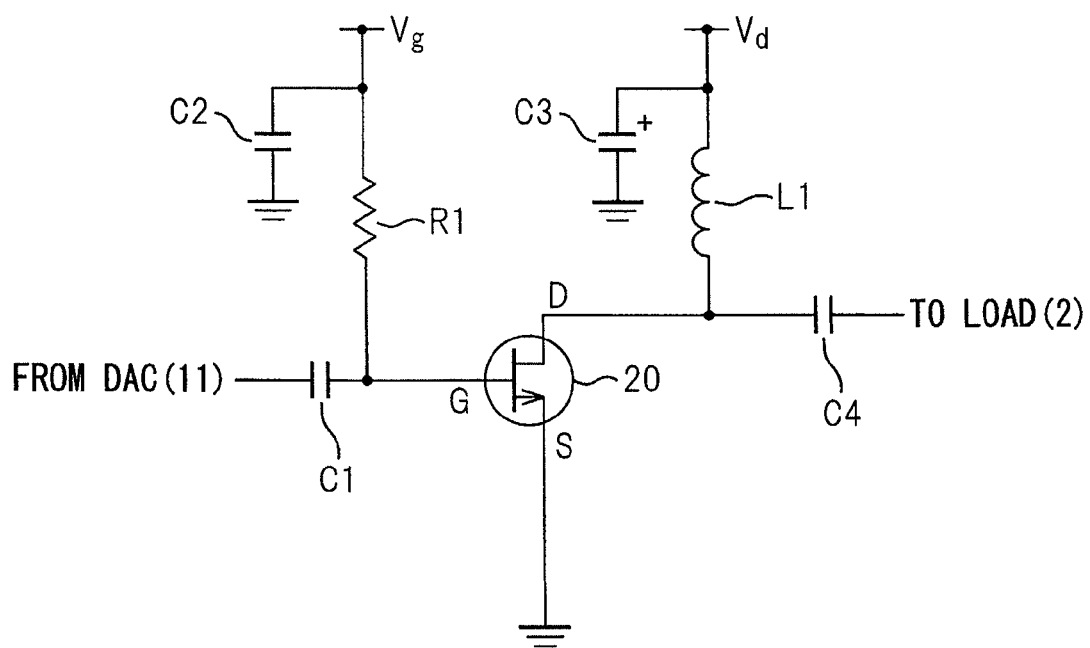
FIG. 5 is an explanatory diagram illustrating a first configuration example of an amplifying unit.

The amplifying unit 13 amplifies the input signal and applies the resulting amplified signal to the load 2. FIG. 5 is an explanatory diagram illustrating a first configuration example of the amplifying unit 13. Reference numeral 20 indicates an n-channel FET, R1 indicates a resistor, C1 to C4 indicate capacitors, and L1 indicates an inductor.

The amplifying unit 13 includes a source grounding circuit for the FET 20 which is used as the amplifying device. The output signal from the DAC 11 is first passed through the DC component removing capacitor C1 and then summed with a gate bias voltage, and the resulting signal is applied to the gate terminal of the FET 20. The gate bias voltage is supplied from a power supply line that supplies predetermined voltage $V_g$ via the resistor R1; this power supply line is grounded via the capacitor C2.

The drain terminal of the FET 20 is coupled via the inductor L1 to a power supply line that supplies voltage $V_d$. This power supply line is grounded via the capacitor C3. The drain terminal of the FET 20 is connected to the load 2 via the DC component removing capacitor 4, and the FET 20 amplifies the input signal supplied from the DAC 11 and applies the resulting amplified signal to the load 2.

Figure 6A:
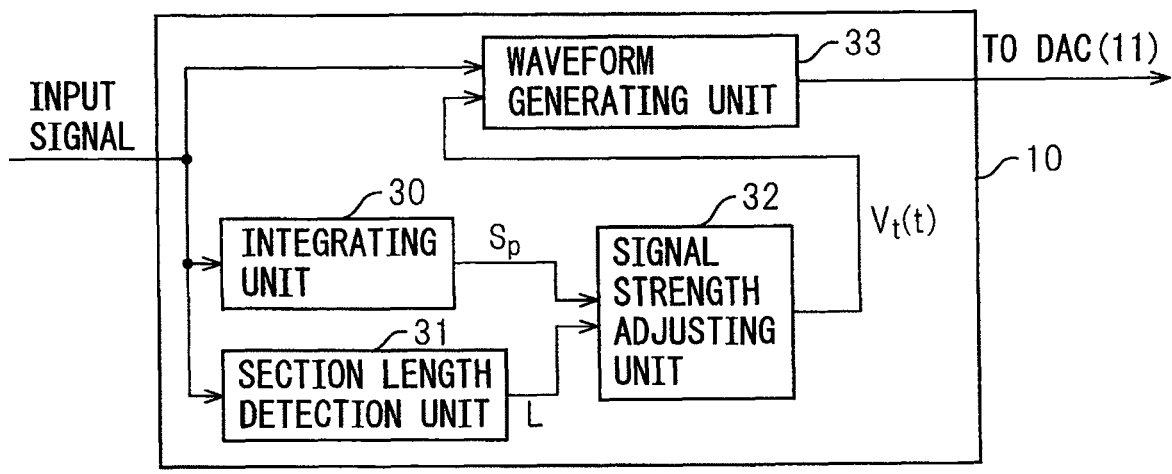
FIGS. 6A to 6C are explanatory diagrams illustrating first to third configuration examples of a waveform modifying unit.
Figure 6B:
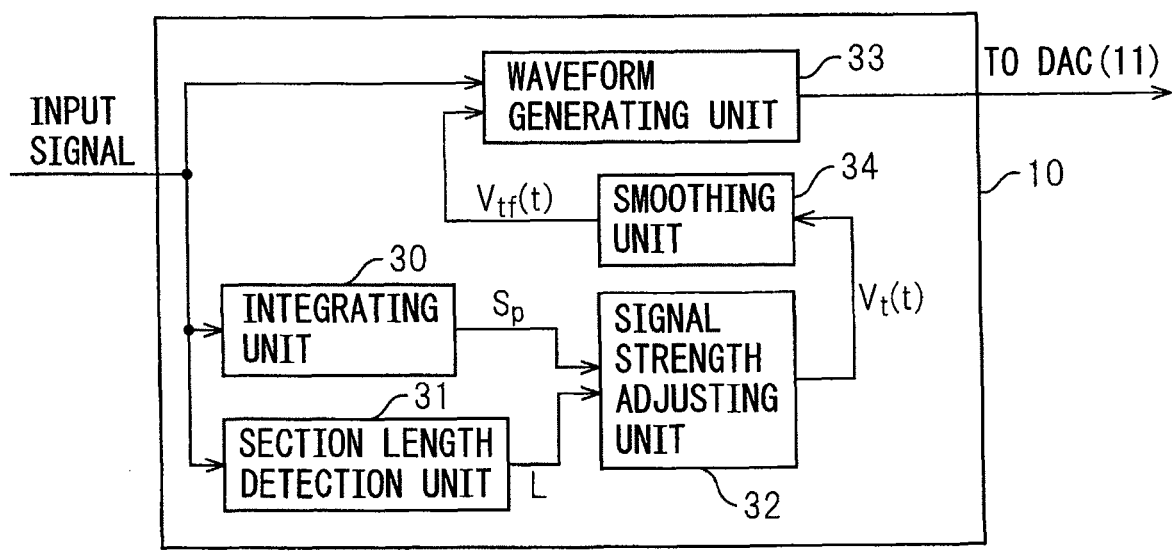
Figure 6C:
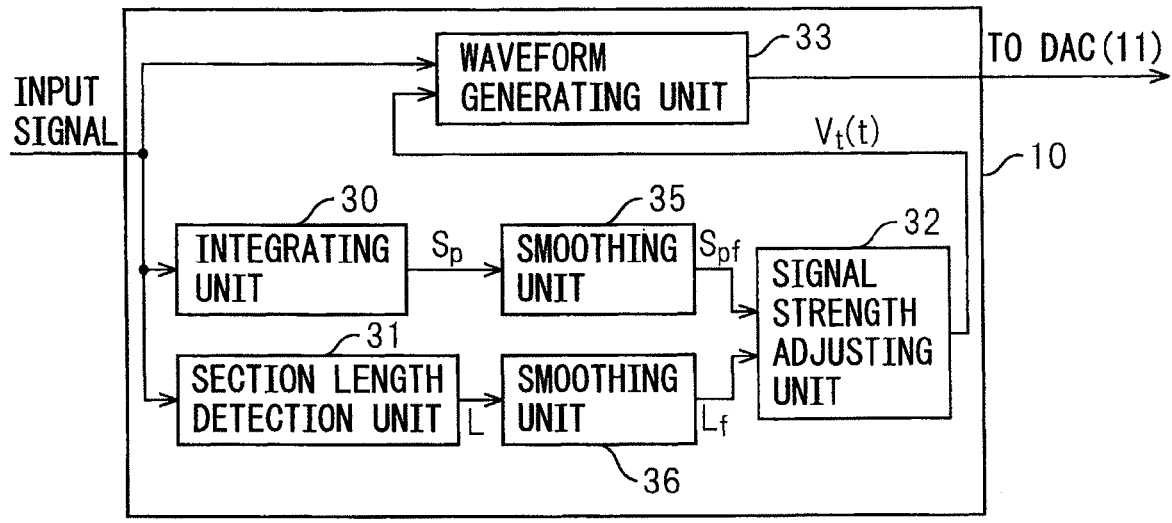

FIGS. 6A to 6C are explanatory diagrams illustrating first to third configuration examples of the waveform modifying unit 10. Reference numeral 30 indicates an integrating unit, 31 indicates a section length detection unit, 32 indicates a signal strength adjusting unit, 33 indicates a waveform generating unit, and 34 to 36 indicate smoothing units.

All or some of the constituent elements 30 to 36 of the waveform modifying unit 10 may be implemented on a dedicated hardware circuit. The waveform modifying unit 10 may include a processor and a storage device for storing an operating program for the processor. All or some of the functions of the constituent elements 30 to 36 may be implemented by the processor executing the operating program. The waveform modifying unit 10 may include a programmable LSI such as an FPGA. The FPGA may be configured to implement all or some of the functions of the constituent elements 30 to 36.

Figure 7:
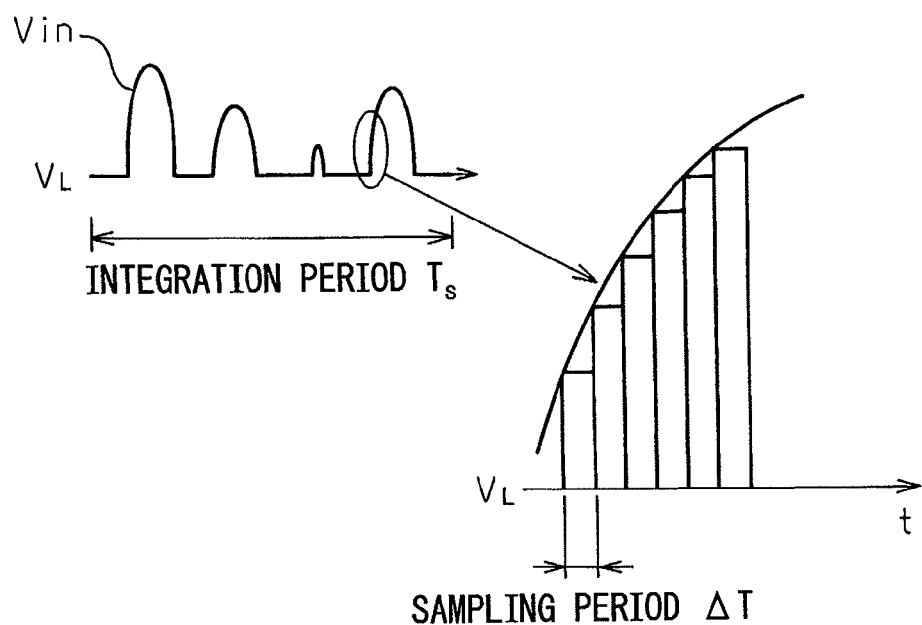
FIG. 7 is an explanatory diagram illustrating how an integrating unit calculates an integrated value.

In the configuration of FIG. 6A, the waveform modifying unit 10 is constructed using the integrating unit 30, section length detection unit 31, signal strength adjusting unit 32, and waveform generating unit 33. The integrating unit 30 calculates an integrated value $S_p$ by integrating the potential difference between the lower limit value $V_L$ and the signal value in the first section T1. FIG. 7 is an explanatory diagram illustrating how the integrating unit 30 calculates the integrated value $S_p$. The integrating unit 30 divides the measurement time of the input signal voltage on the basis of a predetermined integration period $T_s$. The integrating unit 30 then calculates the integrated value $S_p$ in accordance with the following equation (1) by integrating the difference ($V_{in}-V_L$) between the input voltage $V_{in}$ and the lower limit value $V_L$ over the first section T1 in each integration period $T_s$.

$$S_p = \sum_{T1 \; in \; Ts} (V_{in} - V_L) \times \Delta T \quad (1)$$

In equation (1), $\Delta T$ denotes the sampling period of the input signal. If the input signal remains unchanged with its signal value maintained substantially at the lower limit value $V_L$ throughout the second section T2, as illustrated in the waveform example of FIG. 2, the integrating unit 30 may calculate the integrated value $S_p$ by integrating the difference ($V_{in}-V_L$) between the input voltage $V_{in}$ and the lower limit value $V_L$ over the entire integration period $T_s$.

Figure 8:
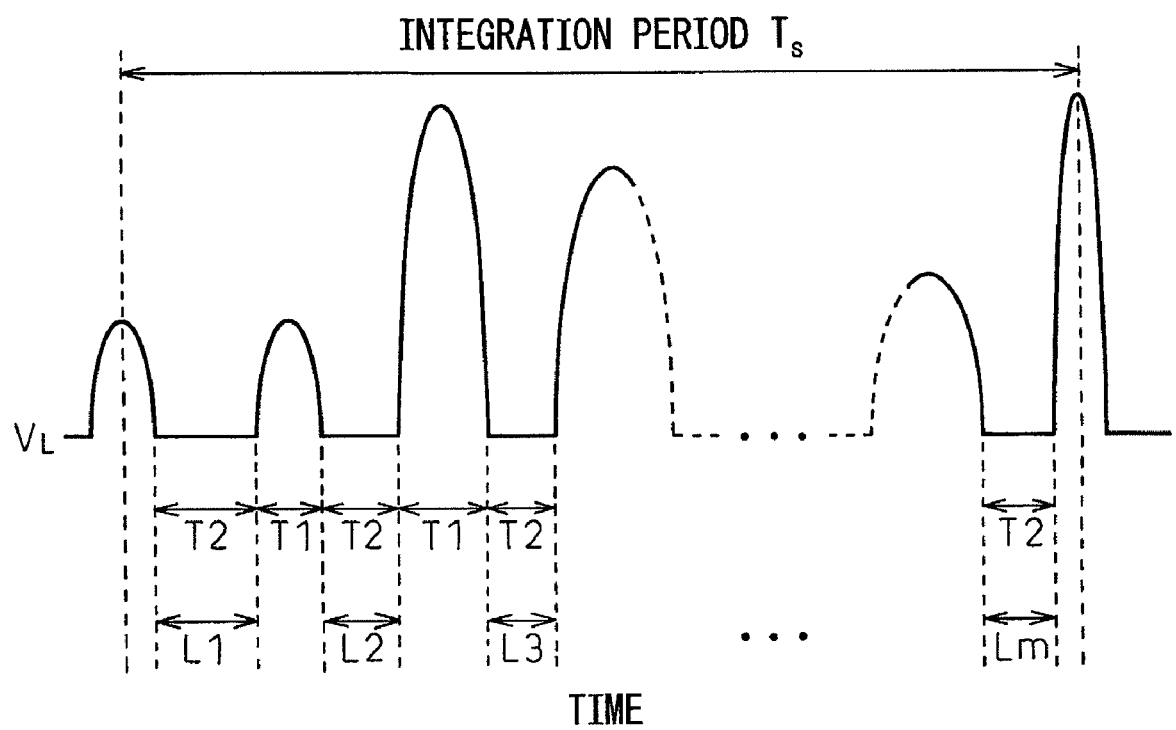
FIG. 8 is an explanatory diagram illustrating the operation of a section length detection unit.

The section length detection unit 31 calculates the combined length L of the second sections T2 contained in each integration period $T_s$. FIG. 8 is an explanatory diagram illustrating the operation of the section length detection unit 31. Suppose that there are m second sections T2 in a given integration period, the lengths of the respective second sections T2 being L1, L2, . . . Lm; in this case, the section length detection unit 31 calculates the combined section length L=(L1+L2+ . . . +Lm).

The signal strength adjusting unit 32 determines, at every predetermined interval of time, the signal strength $V_t(t)$ given by the following equation (2). Time t indicates the determination timing at which the signal strength adjusting unit 32 determines the signal strength $V_t(t)$. $V_t(t)$ represents the signal strength that is determined at a given determination timing t by the signal strength adjusting unit 32.

$$V_t(t) = S_p/L \quad (2)$$

The waveform generating unit 33 takes as an input the signal strength $V_t(t)$ determined by the signal strength adjusting unit 32. The waveform generating unit 33 generates the waveform of the input signal in the second section T2 so that the signal value in the second section T2 becomes equal to ($V_L-V_t(t)$). By thus generating the waveform in the second section T2 using the waveform generating unit 33, the waveform of the input signal is modified as illustrated in FIG. 9.

Figure 9:
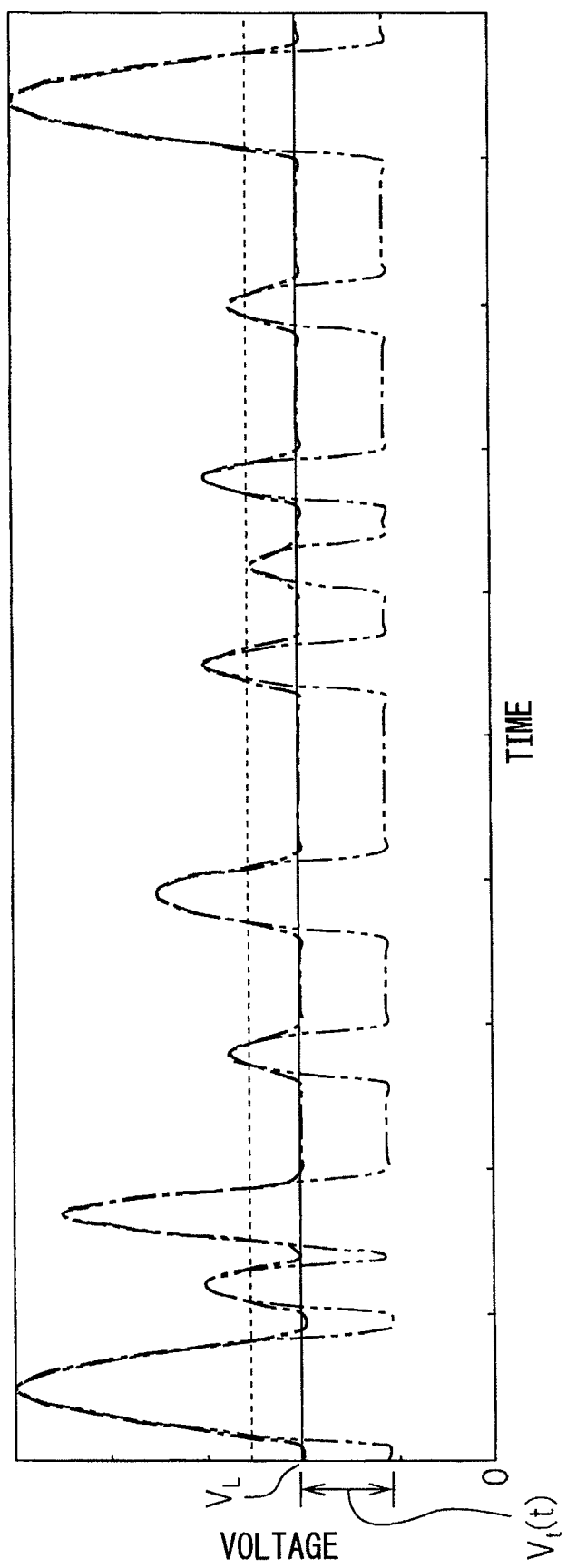
FIG. 9 is an explanatory diagram (part 1) illustrating a modified waveform of the input signal.

In FIG. 9, the semi-dashed line indicates the waveform of the input signal, and the double-dashed line indicates the modified waveform of the input signal when the waveform in the second section T2 is generated by the waveform generating unit 33. The dashed line indicates the DC level of the input signal, and the solid line indicates the DC level of the modified input signal. As illustrated in FIG. 9, by thus generating the waveform in the second section T2 using the waveform generating unit 33, a rectangular wave having an amplitude $V_t(t)$ with respect to the lower limit value $V_L$ is inserted in each second section T2.

As can be seen from the above equation (2), the integrated value $S_p$ of the difference ($V_{in}-V_L$) taken between the input voltage $V_{in}$ and the lower limit value $V_L$ over the first section T1 is equal to the integrated value of the difference ($V_L-V_{in}$), i.e., $V_t(t)$, taken between the input voltage $V_{in}$ and the lower limit value $V_L$ over the second section T2. As a result, the DC level of the modified input signal becomes equal to the lower limit value $V_L$.

Accordingly, when the thus modified input signal is supplied to the amplifying unit 13 of FIG. 5, and the gate bias voltage is added to the modified input signal after removing its DC component by the capacitor C1, the DC level indicated by the solid line becomes identical with the gate bias voltage. As a result, the output waveform from the amplifying unit 13 has a shape such that the modified waveform of the input signal, indicated by the double-dashed line, is sliced at the DC level indicated by the solid line, i.e., the lower limit value $V_L$ of the variation range of the signal value in the first section.

This indicates that the waveform in the first section is amplified by the amplifying unit 13 without being sliced by the gate bias voltage. In this way, according to the present embodiment, the waveform of the input signal in the first section can be amplified without slicing it, and the reproducibility of the signal waveform amplified by the amplifying unit 13 can thus be enhanced. Instead of and/or in addition to generating the waveform of the input signal in the second section T2, the waveform generating unit 33 may change the waveform of the input signal in the first section T1 uniformly by $\Delta V$ over the entire first section T1 and thereby modify the waveform of the input signal so that the difference between the lower limit value ($V_L+\Delta V$) of the thus changed signal value in the first section T1 and the signal value in the second section T2 becomes equal to $V_t(t)$). For example, the waveform generating unit 33 may perform processing so as to raise the waveform of the input signal in the first section T1 uniformly by an amount equal to $V_t(t)$ over the entire first section T1. In this way, the changing of the signal value in the second section T2 by the waveform generating unit 33 may be accomplished by changing the signal value in the first section T1 thereby changing the signal value in the second section T2 relative to the signal value in the first section T1.

In the configuration of FIG. 6B, the waveform modifying unit 10 is constructed using the integrating unit 30, section length detection unit 31, signal strength adjusting unit 32, waveform generating unit 33, and smoothing unit 34. The smoothing unit 34 smoothes the variation of the signal strength $V_t(t)$ determined by the signal strength adjusting unit 32. The smoothing unit 34 outputs signal strength $V_{tf}(t)$ by smoothing the variation of the signal strength $V_t(t)$. The waveform generating unit 33 generates the waveform of the input signal in the second section T2 so that the signal value in the second section T2 becomes equal to $(V_L - V_{tf}(t))$.

The smoothing unit 34 may be configured to smooth the variation of the signal strength $V_t(t)$ by calculating the moving average value of the signal strength $V_t(t)$ and taking it as the signal strength $V_{tf}(t)$. For example, the smoothing unit 34 may be implemented as an accumulator that stores the signal strength $V_t(t)$ determined at each of the past n timings as $V_t(i)$ (i is an integer between 1 and n) and that calculates the smoothed signal strength $V_{tf}(t)$ in accordance with the following equation (3).

$$V_{tf}(t)=(V_t(1)+V_t(2)+\ldots+V_t(n))/n \qquad (3)$$

In the configuration of FIG. 6C, the waveform modifying unit 10 is constructed using the integrating unit 30, section length detection unit 31, signal strength adjusting unit 32, waveform generating unit 33, and smoothing units 35 and 36. The smoothing unit 35 smoothes the variation of the integrated value $S_p$ calculated by the integrating unit 30. The smoothing unit 35 outputs an integrated value $S_{pf}$ by smoothing the variation of the integrated value $S_p$.

The smoothing unit 36 smoothes the variation of the combined section length L calculated by the section length detection unit 31. The smoothing unit 36 outputs a combined section length $L_f$ by smoothing the variation of the combined section length L. The signal strength adjusting unit 32 determines, at every predetermined interval of time, the signal strength $V_t(t)$ given by the following equation (4). When the variation of the integrated value $S_p$ and the variation of the combined section length L are smoothed, the variation of the signal strength $V_t(t)$ determined by the signal strength adjusting unit 32 is also smoothed.

$$V_t(t)=S_{pf}/L_f \qquad (4)$$

The smoothing unit 35 may be configured to smooth the variation of the integrated value $S_p$ by calculating the moving average value of the integrated value $S_p$ and taking it as the integrated value $S_{pf}$. For example, the smoothing unit 35 may be implemented as an accumulator that stores the integrated value $S_p$ calculated at each of the past n timings as $S_p(i)$ (i is an integer between 1 and n) and that calculates the smoothed integrated value $S_{pf}$ in accordance with the following equation (5).

$$S_{pf}=(S_p(1)+S_p(2)+\ldots+S_p(n))/n \qquad (5)$$

The smoothing unit 36 may be configured to smooth the variation of the combined section length L by calculating the moving average value of the combined section length L and taking it as the combined section length $L_f$. For example, the smoothing unit 36 may be implemented as an accumulator that stores the combined section length L calculated at each of the past n timings as $L(i)$ (i is an integer between 1 and n) and that calculates the smoothed combined section length $L_f$ in accordance with the following equation (6).

$$L_f=(L(1)+L(2)+\ldots+L(n))/n \qquad (6)$$

Figure 10:
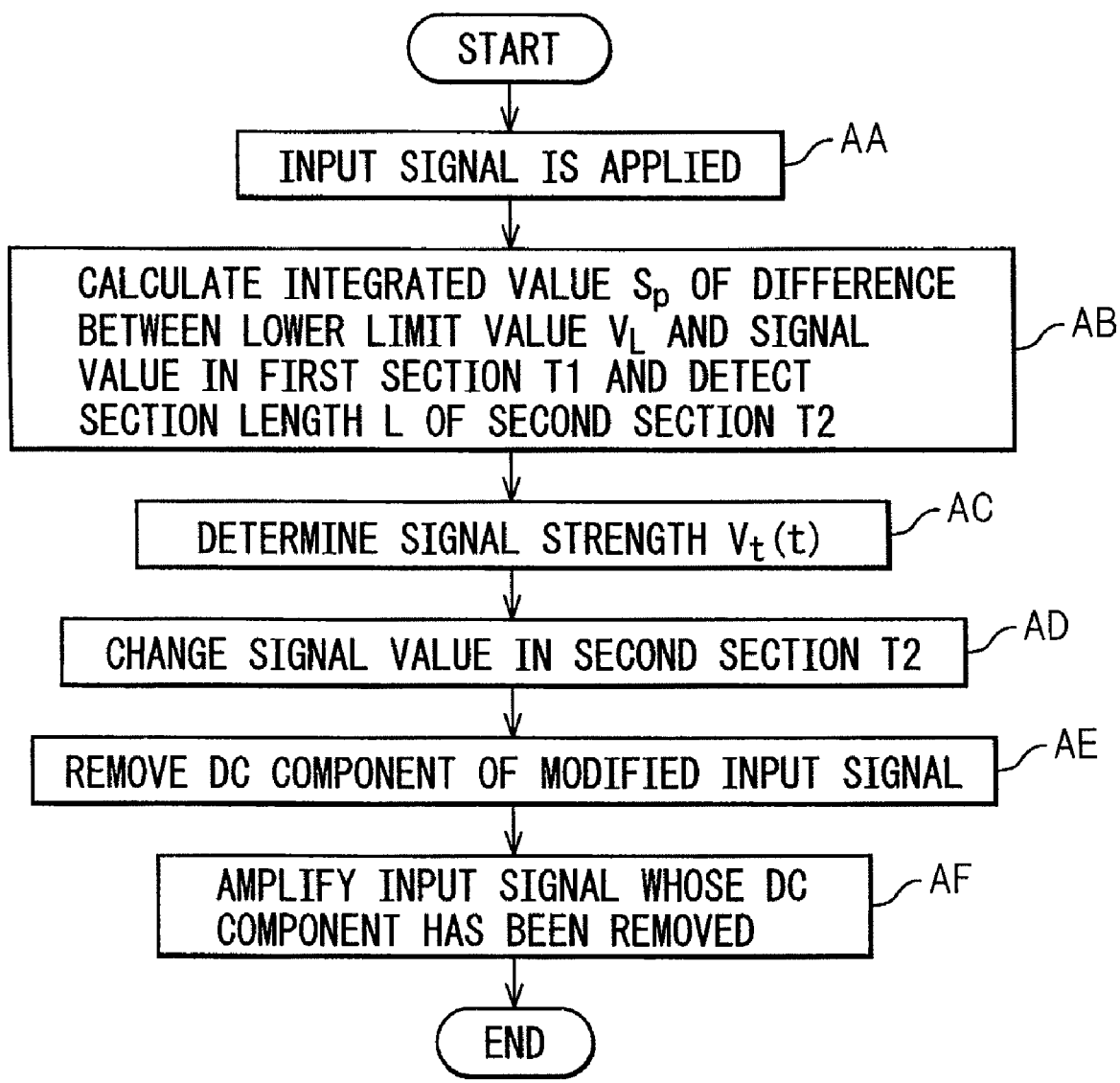
FIG. 10 is an explanatory diagram illustrating a first example of a signal amplifying method according to the present disclosure.

FIG. 10 is an explanatory diagram illustrating a first example of a signal amplifying method according to the present disclosure. In an alternative embodiment, the following operations AA to AF may be implemented as steps.

In operation AA, the input signal is applied to the amplifying circuit 1. This input signal is applied to the integrating unit 30, section length detection unit 31, and waveform generating unit 33 in the waveform modifying unit 10.

In operation AB, the integrating unit 30 calculates the integrated value $S_p$ over the integration period $T_s$ in the earlier described manner. Further, the section length detection unit 31 calculates the combined length L of the second sections T2 contained in the integration period $T_s$. The variation of the integrated value $S_p$ and the variation of the combined section length L may be smoothed by the smoothing units 35 and 36, respectively.

In operation AC, the signal strength adjusting unit 32 determines the signal strength $V_t(t)$ in the earlier described manner. The variation of the signal strength $V_t(t)$ may be smoothed by the smoothing unit 34.

In operation AD, the waveform generating unit 33 generates the waveform of the input signal in the second section T2 in the earlier described manner. By generating the waveform in the second section T2 using the waveform generating unit 33, the waveform of the input signal is modified. The modified input signal is supplied to the amplifying unit 13.

In operation AE, the DC component removing capacitor C1 in the amplifying unit 13 removes the DC component of the modified input signal. The gate bias voltage is added to the input signal whose DC component has been removed.

In operation AF, the input signal, from which the DC component has been removed and to which the gate bias voltage has been added, is amplified by the FET 20. Since the DC level of the input signal to which the gate bias voltage has been added is identical with the lower limit value $V_L$ of the variation range of the signal value in the first section, the waveform of the input signal in the first section is amplified by the FET 20 without being sliced.

In the above embodiment, the waveform generating unit 33 has been described as modifying the waveform of the input signal by inserting a rectangular wave of amplitude $V_t(t)$ in each second section T2, as illustrated in FIG. 9. However, the waveform of the signal to be inserted in each second section T2 is not limited to any particular shape, but any suitable waveform may be inserted as long as it has a shape that reduces the difference between the DC level of the modified input signal and the lower limit value $V_L$ of the variation range of the signal value in the first section T1.

Figure 11A:
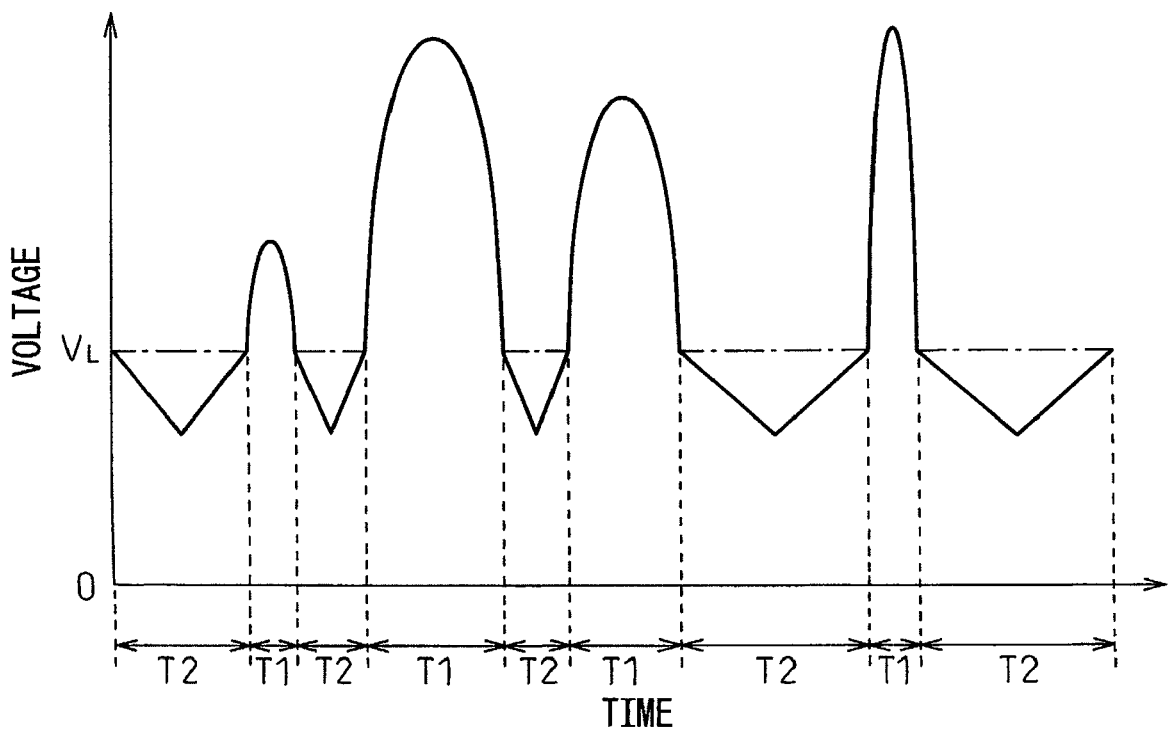
FIGS. 11A and 11B are explanatory diagrams illustrating alternative examples of the modified input signal waveform.
Figure 11B:
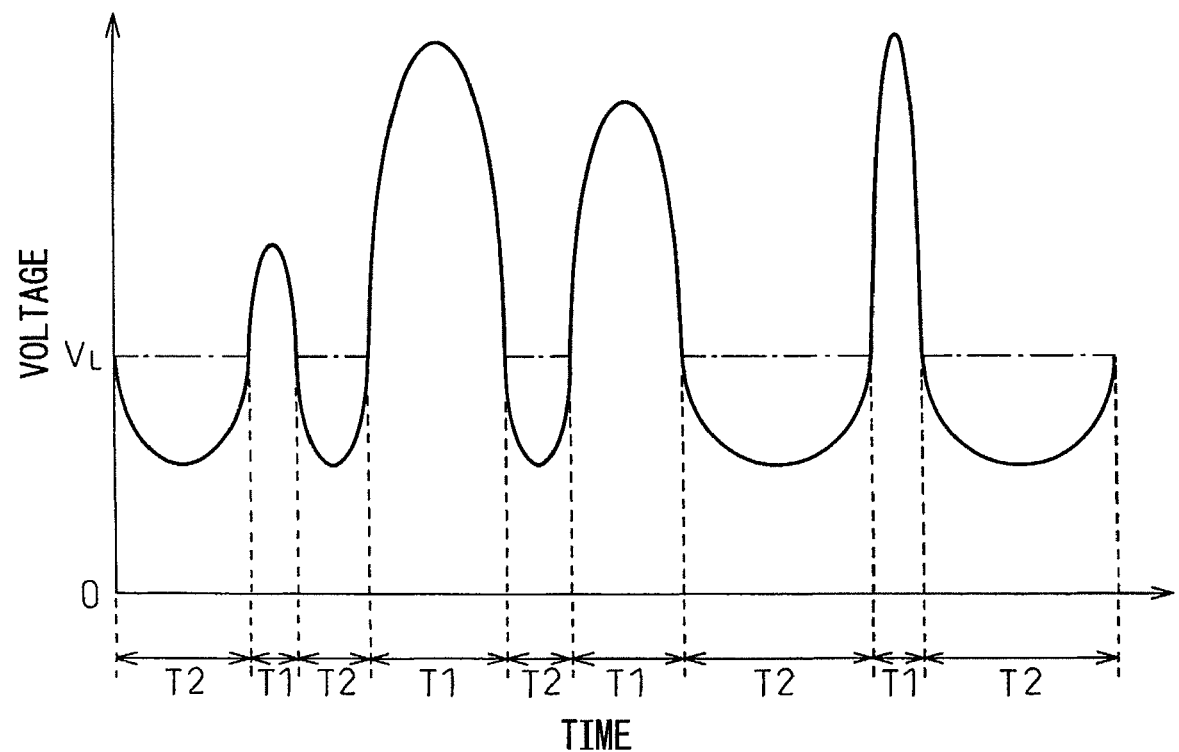

FIGS. 11A and 11B are explanatory diagrams illustrating alternative examples of the modified input signal waveform. In the example of FIG. 11A, the waveform generating unit 33 inserts a rectangular wave in each second section T2. In the example of FIG. 11B, the waveform generating unit 33 inserts a sine wave in each second section T2. When the waveform generating unit 33 inserts one or the other of these waveforms in the second section T2, the signal strength adjusting unit 32 calculates the signal strength $V_t(t)$ appropriate to the waveform to be inserted. The same applies to any of the examples described below.

Figure 12A:
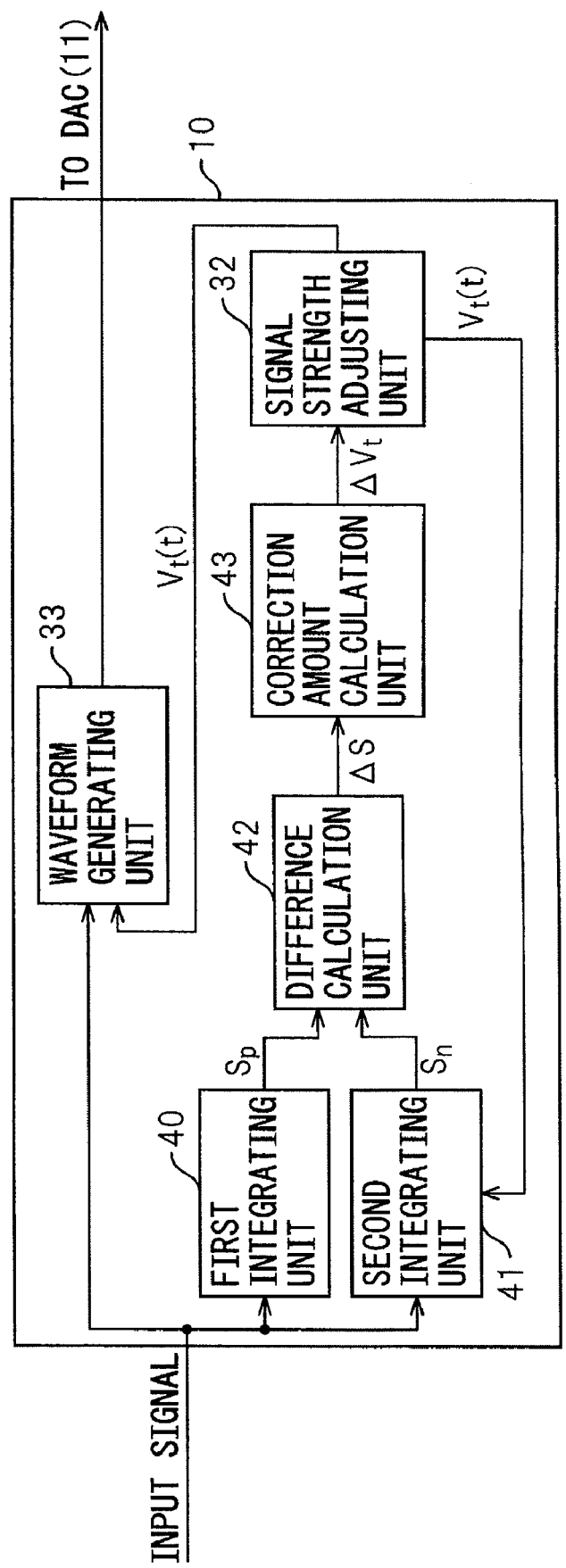
FIGS. 12A to 12C are explanatory diagrams illustrating fourth to sixth configuration examples of the waveform modifying unit.
Figure 12B:
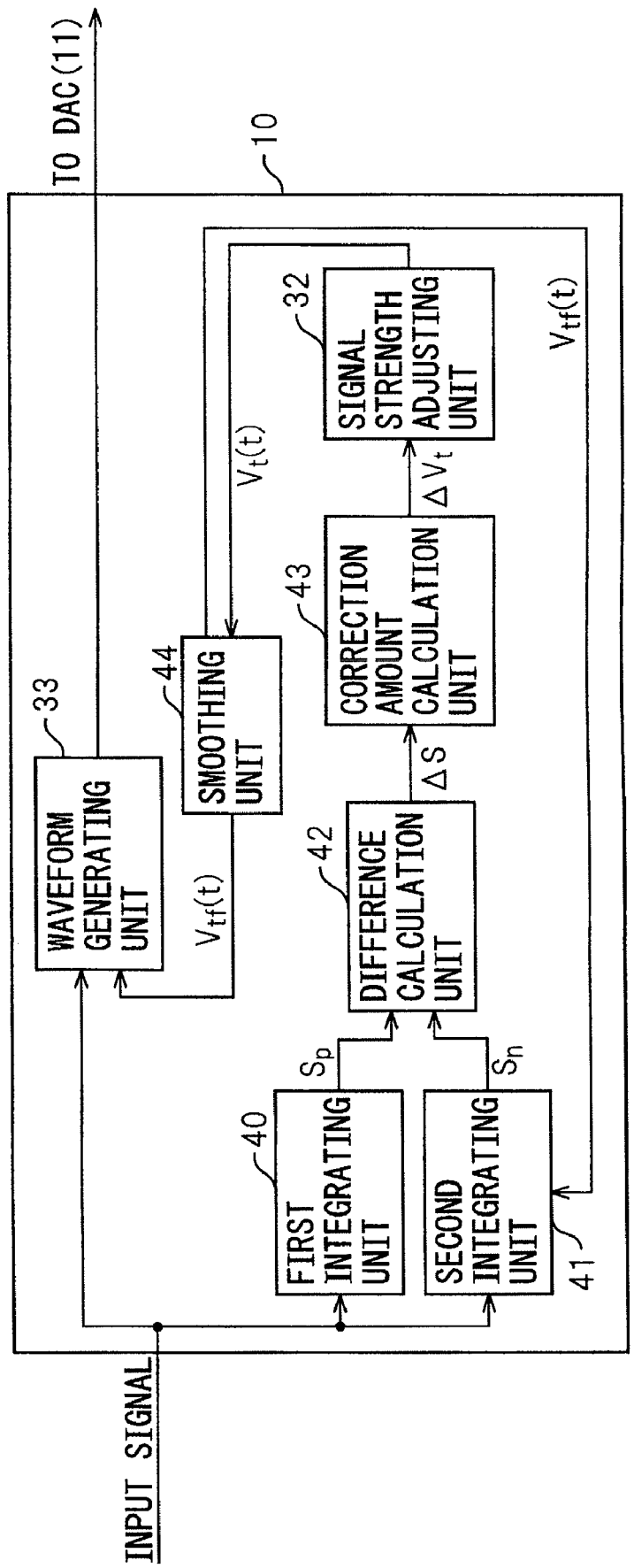
Figure 12C:
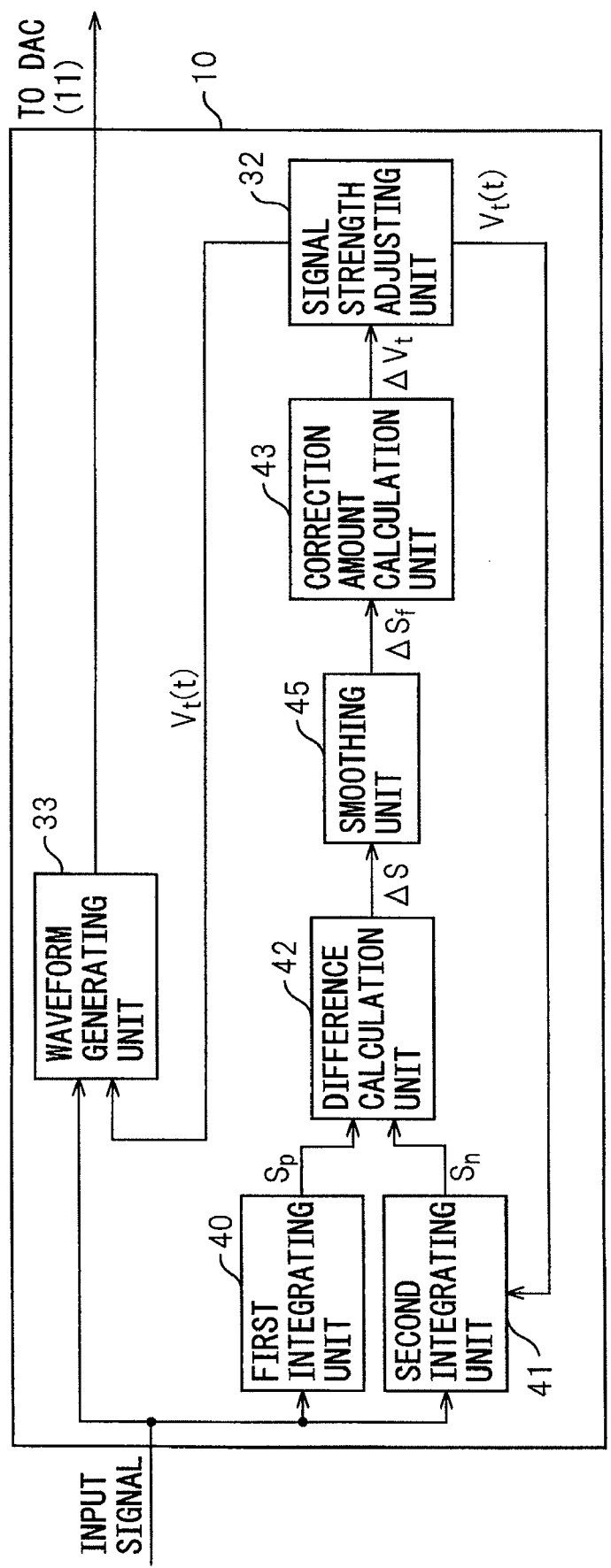

FIGS. 12A to 12C are explanatory diagrams illustrating fourth to sixth configuration examples of the waveform modifying unit 10. Reference numeral 40 indicates a first integrating unit, 41 indicates a second integrating unit, 42 indicates a difference calculation unit, 43 indicates a correction amount calculation unit, and 44 and 45 indicate smoothing units.

All or some of the constituent elements 32, 33 and 40 to 45 of the waveform modifying unit 10 may be implemented on a dedicated hardware circuit. The waveform modifying unit 10 may include a processor and a storage device for storing an operating program for the processor. All or some of the functions of the constituent elements 32, 33, and 40 to 45 may be implemented by the processor executing the operating program. The waveform modifying unit 10 may include a programmable LSI such as an FPGA. The FPGA may be configured to implement all or some of the functions of the constituent elements 32, 33, and 40 to 45.

In the configuration of FIG. 12A, the waveform modifying unit 10 is constructed using the first integrating unit 40, second integrating unit 41, difference calculation unit 42, correction amount calculation unit 43, signal strength adjusting unit 32, and waveform generating unit 33.

The waveform generating unit 33, like the waveform generating unit 33 previously described with reference to FIG. 6A, generates the waveform of the input signal in the second section T2 in accordance with the signal strength $V_t(t)$ determined by the signal strength adjusting unit 32. By thus generating the waveform in the second section T2 using the waveform generating unit 33, the waveform of the input signal is modified.

The first integrating unit 40 calculates the integrated value $S_p$ by integrating the potential difference between the lower limit value $V_L$ and the signal value in the first section T1 in the same manner as the integrating unit 30 previously described with reference to FIG. 6A. If the input signal remains unchanged with its signal value maintained substantially at the lower limit value $V_L$ throughout the second section T2, the first integrating unit 40 may calculate the integrated value $S_p$ by integrating the difference $(V_{in}-V_L)$ between the input voltage $V_{in}$ and the lower limit value $V_L$ over the entire integration period $T_s$.

Figure 13:
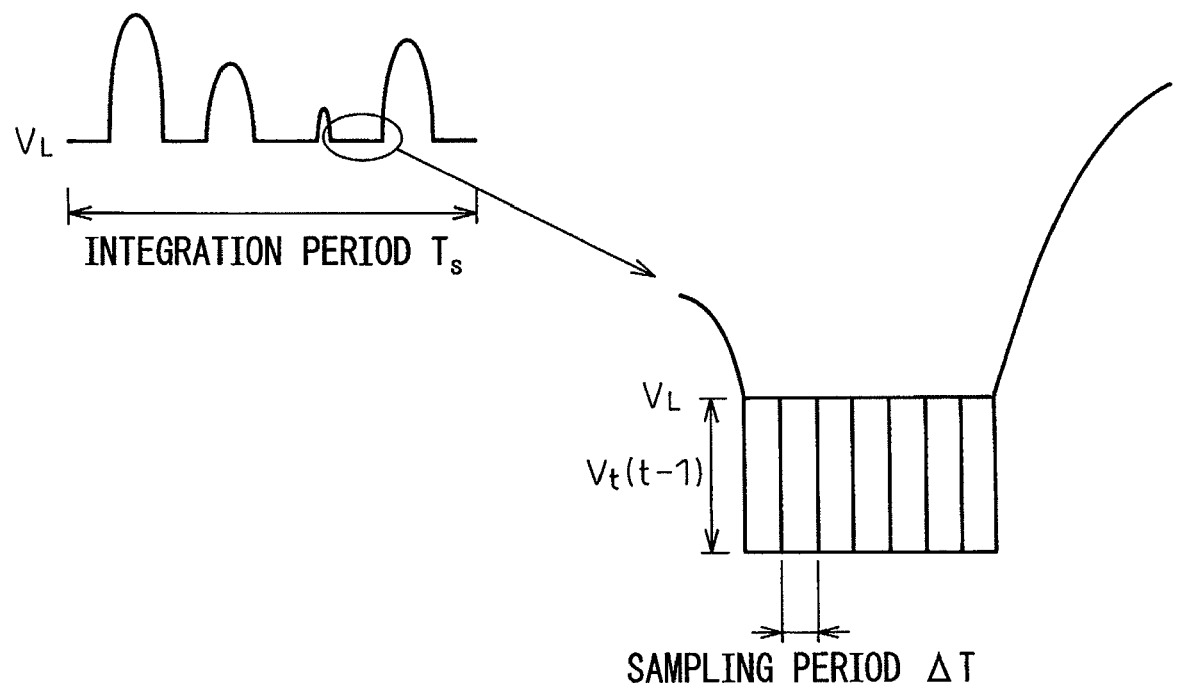
FIG. 13 is an explanatory diagram illustrating how a second integrating unit calculates an integrated value.

The second integrating unit 41 takes as inputs the input signal and the signal strength $V_t(t)$ determined by the signal strength adjusting unit 32. The second integrating unit 41 calculates an integrated value $S_n$ by integrating the potential difference between the lower limit value $V_L$ of the signal in the first section T1 and the signal value of the waveform in the second section T2 that the waveform generating unit 33 generates based on the signal strength $V_t(t-1)$ determined by the signal strength adjusting unit 32 at the previous timing. FIG. 13 is an explanatory diagram illustrating how the second integrating unit 41 calculates the integrated value.

The second integrating unit 41 calculates the integrated value $S_n$ in accordance with the following equation (7) by integrating the difference $(V_L-V_t(t-1))$ between the lower limit value $V_L$ and the input voltage $V_t(t-1)$ over the second section T2 in each integration period $T_s$.

$$S_n = \sum_{T2 \ in \ Ts} (V_L - V_t(t-1)) \times \Delta T \quad (7)$$

The difference calculation unit 42 calculates the difference $\Delta S = (S_p - S_n)$ between the integrated value $S_p$ calculated by the first integrating unit 40 and the integrated value $S_n$ calculated by the second integrating unit 41.

Based on the difference $\Delta S$, the correction amount calculation unit 43 calculates a signal strength correction amount $\Delta V_t$, i.e., the amount by which to correct the signal strength $V_t(t)$. The correction amount calculation unit 43 may take the difference $\Delta S$ itself as the signal strength correction amount $\Delta V_t$, as indicated by the following equation (8).

$$\Delta V_t = (S_p - S_n) \quad (8)$$

The signal strength adjusting unit 32 corrects the signal strength $V_t(t)$ in accordance with the following equation (9) by adding the signal strength correction amount $\Delta V_t$ to the signal strength $V_t(t-1)$ determined at the immediately preceding determination timing (t-1).

$$V_t(t) = V_t(t-1) + \Delta V_t \quad (9)$$

According to the signal strength $V_t(t)$ correction method described above, if the integrated value $S_p$ of the difference between the lower limit value $V_L$ and the signal value in the first section T1 is larger than the integrated value $S_n$ of the difference between the lower limit value $V_L$ and the signal value in the second section T2 ($S_p > S_n$), the signal strength adjusting unit 32 increases $V_t(t)$. When $S_p > S_n$, the DC level of the modified input signal waveform is higher than the lower limit value $V_L$ because the amplitude $V_t(t)$ of the signal in the second section T2 is too small. Accordingly, the signal strength adjusting unit 32 increases $V_t(t)$ in order to bring the DC level of the modified input signal waveform closer to the lower limit value $V_L$.

On the other hand, if $S_p < S_n$, the signal strength adjusting unit 32 reduces $V_t(t)$. When $S_p < S_n$, the DC level of the modified input signal waveform is lower than the lower limit value $V_L$ because the amplitude $V_t(t)$ of the signal in the second section T2 is too large. Accordingly, the signal strength adjusting unit 32 reduces $V_t(t)$ in order to bring the DC level of the modified input signal waveform closer to the lower limit value $V_L$.

In the configuration of FIG. 12B, constitute the waveform modifying unit 10 is constructed using the first integrating unit 40, second integrating unit 41, difference calculation unit 42, correction amount calculation unit 43, signal strength adjusting unit 32, waveform generating unit 33, and smoothing unit 44. The smoothing unit 44, like the smoothing unit 34 in FIG. 6B, outputs signal strength $V_{tf}(t)$ by smoothing the variation of the signal strength $V_t(t)$. The waveform generating unit 33 generates the waveform of the input signal in the second section T2 so that the signal value in the second section T2 becomes equal to $(V_L - V_{tf}(t))$. The second integrating unit 41 calculates the integrated value $S_n$ by integrating the potential difference between the lower limit value $V_L$ of the signal in the first section T1 and the signal value of the waveform in the second section T2 that the waveform generating unit 33 generates based on the smoothed signal strength $V_{tf}(t-1)$.

In the configuration of FIG. 12C, the waveform modifying unit 10 is constructed using the first integrating unit 40, second integrating unit 41, difference calculation unit 42, correction amount calculation unit 43, signal strength adjusting unit 32, waveform generating unit 33, and smoothing unit 45. The smoothing unit 44 smoothes the variation of the difference $\Delta S$ calculated by the difference calculation unit 42. The smoothing unit 44 outputs a difference $\Delta S_f$ by smoothing the variation of the difference $\Delta S$. Based on the difference $\Delta S_f$, the correction amount calculation unit 43 calculates a signal strength correction amount $\Delta V_t$, i.e., the amount by which to correct the signal strength $V_t(t)$. The correction amount calculation unit 43 may take the difference $\Delta S_f$ itself as the signal strength correction amount $\Delta V_t$. When the difference $\Delta S$ is smoothed, the variation of the signal strength $V_t(t)$ determined by the signal strength adjusting unit 32 is also smoothed.

The smoothing unit 45 may be configured to smooth the variation of the difference $\Delta S$ by calculating the moving average value of the difference $\Delta S$ and taking it as the difference $\Delta S_f$. For example, the smoothing unit 45 may be implemented as an accumulator that stores the difference $\Delta S$ determined at each of the past n timings as $\Delta S(i)$ (i is an integer between 1 and n) and that calculates the smoothed difference $\Delta S_f$ in accordance with the following equation (10).

$$\Delta S_f(t) = (\Delta S(1) + \Delta S(2) + \ldots + \Delta S(n))/n \quad (10)$$

Figure 14:
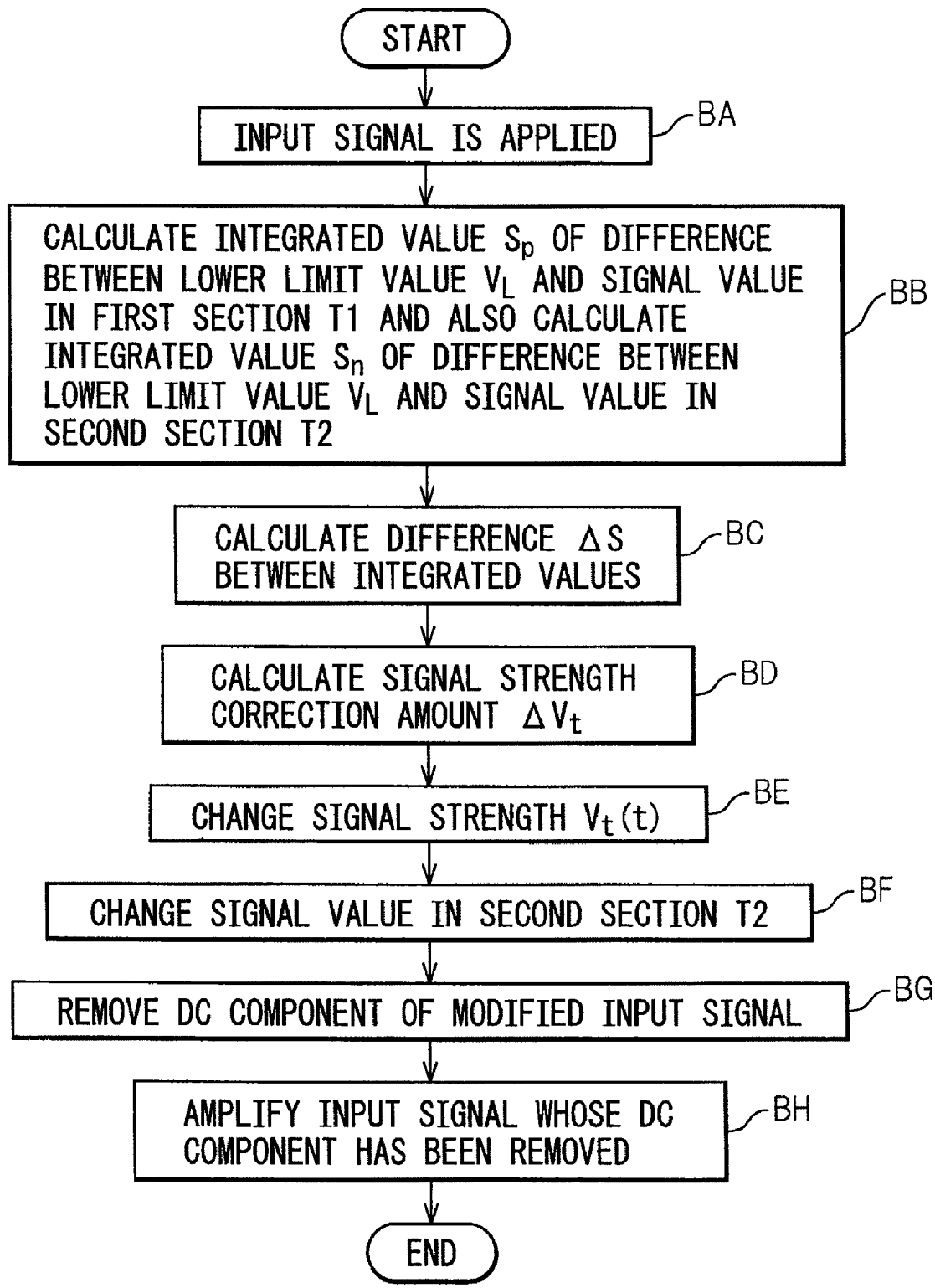
FIG. 14 is an explanatory diagram illustrating a second example of the signal amplifying method according to the present disclosure.

FIG. 14 is an explanatory diagram illustrating a second example of the signal amplifying method according to the present disclosure. In an alternative embodiment, the following operations BA to BH may be implemented as steps.

In operation BA, the input signal is applied to the amplifying circuit 1. This input signal is applied to the first integrating unit 40, second integrating unit 41, and waveform generating unit 33 in the waveform modifying unit 10.

In operation BB, the first integrating unit 40 calculates the integrated value $S_p$ over the integration period $T_s$ in the earlier described manner. Further, the second integrating unit 41 calculates the integrated value $S_n$ over the integration period $T_s$ in the earlier described manner.

In operation BC, the difference calculation unit 42 calculates the difference ΔS in the earlier described manner. The variation of the difference ΔS may be smoothed by the smoothing unit 45. In operation BD, the correction amount calculation unit 43 calculates the signal strength correction amount $\Delta V_r$ in the earlier described manner. In operation BE, the signal strength adjusting unit 32 determines the signal strength $V_r(t)$ in the earlier described manner. The variation of the signal strength $V_r(t)$ may be smoothed by the smoothing unit 44.

In operation BF, the waveform generating unit 33 generates the waveform of the input signal in the second section T2 in the earlier described manner. The waveform of the input signal is thus modified.

In operation BG, the DC component removing capacitor C1 in the amplifying unit 13 removes the DC component of the modified input signal. The gate bias voltage is added to the input signal whose DC component has been removed.

In operation BH, the input signal, from which the DC component has been removed and to which the gate bias voltage has been added, is amplified by the FET 20. Since the DC level of the input signal to which the gate bias voltage has been added is identical with the lower limit value $V_L$ of the variation range of the signal value in the first section, the waveform of the input signal in the first section is amplified by the FET 20 without being sliced.

As described above, according to the amplifying circuit 1 of the present embodiment, when the waveform is modified by the waveform generating unit 33, the DC level of the input signal becomes closer to the lower limit value $V_L$ of the variation range of the signal value in the first section. As a result, in the output waveform from the amplifying circuit 1, the amount by which the waveform in the first section is sliced is minimized. This serves to enhance the reproducibility of the waveform of the signal amplified by the amplifying circuit 1.

Next, a description will be given of the time constant that defines how fast the signal strength $V_r(t)$ changes in response to a change in the input waveform. The value of the signal strength $V_r(t)$ increases as the integrated value $S_p$ of the potential difference between the lower limit value $V_L$ and the signal value in the first section T1 increases. As a result, the value of the signal strength $V_r(t)$ changes in accordance with the proportion of the first section T1 to the second section T2. In the following description, the proportion that the first section T1 occupies in a given section may be referred to as the "duty ratio."

Figure 15:
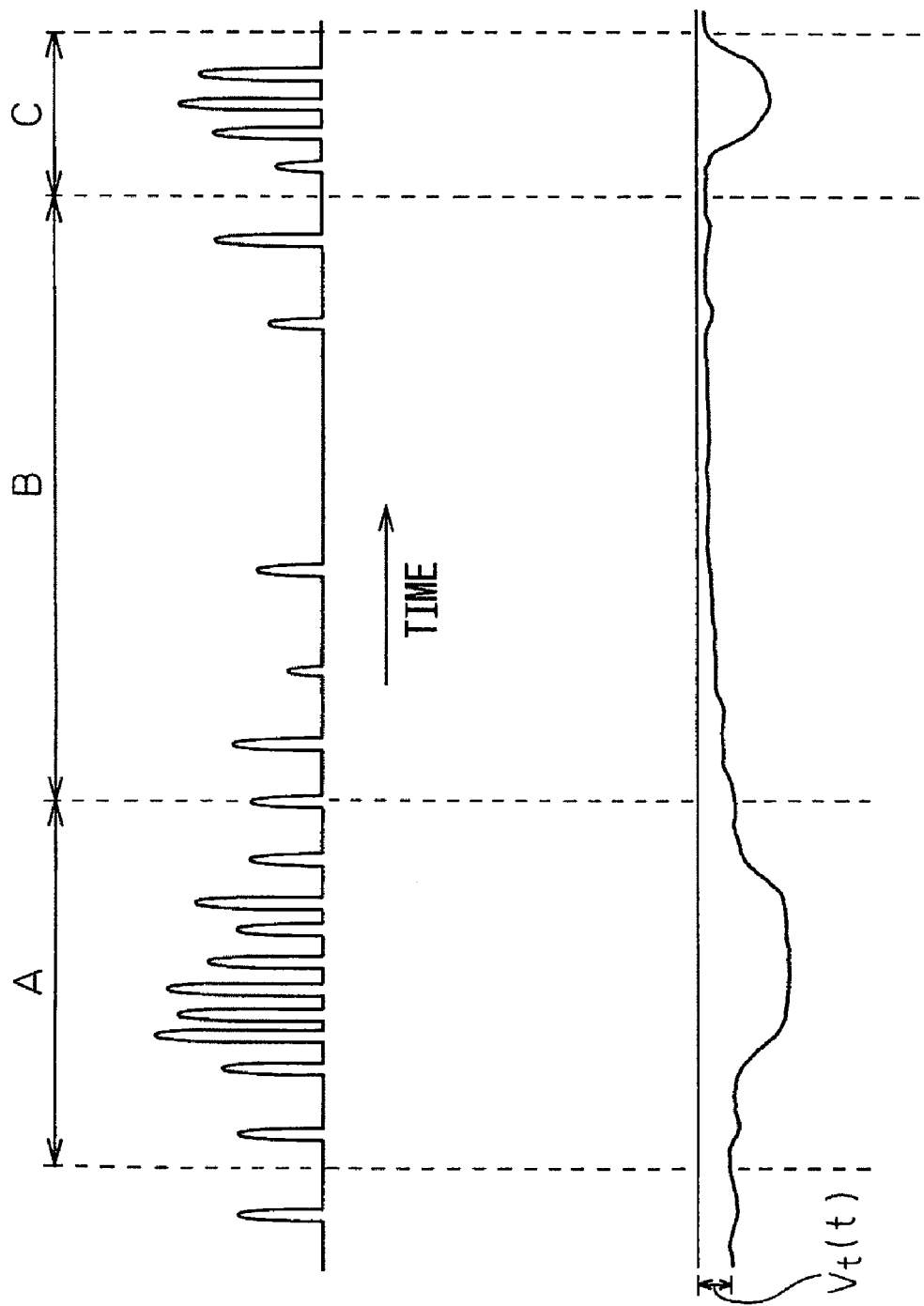
FIGS. 15A and 15B are explanatory diagrams illustrating how signal strength $V_t$ changes with the duty ratio of the input signal.

FIG. 15A is a diagram illustrating how the duty ratio of the input signal changes. FIG. 15B is a diagram illustrating how the signal strength $V_r(t)$ changes with the duty ratio of the input signal. When the duty ratio increases in section A or C, the signal strength $V_r(t)$ increases. When the duty ratio decreases in section B, the signal strength $V_r(t)$ decreases.

Figure 16:
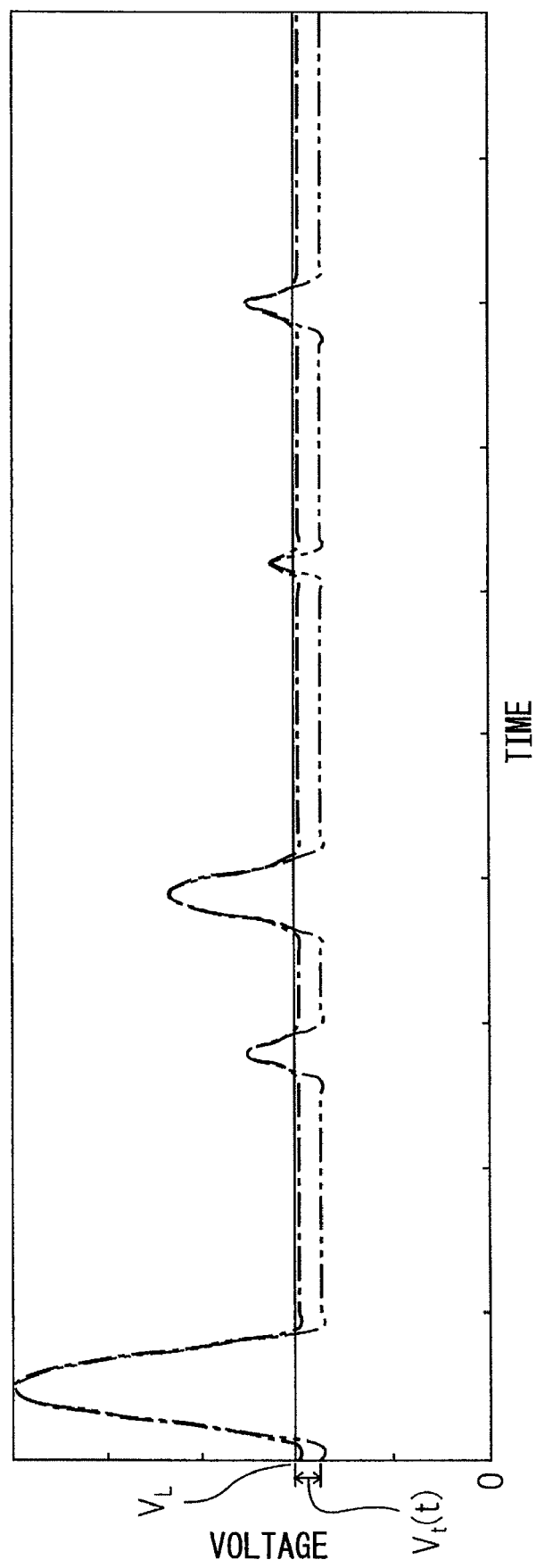
FIG. 16 is an explanatory diagram (part 2) illustrating a modified waveform of the input signal.

FIG. 16 is an explanatory diagram illustrating the modified waveform of the input signal during a period where the duty ratio is relatively small. In FIG. 16, the semi-dashed line indicates the waveform of the input signal, and the double-dashed line indicates the modified waveform of the input signal after the waveform in the second section T2 has been generated by the waveform generating unit 33. The solid line indicates the DC level of the modified input signal.

Compared with the input signal waveform of FIG. 9, the duty ratio of the input signal waveform of FIG. 16 is small. Accordingly, in the input signal of FIG. 16, the integrated value $S_p$ of the difference ($V_{in}-V_L$) between the lower limit value $V_L$ and the input voltage $V_{in}$ in the first section T1 is smaller than that in the input signal waveform of FIG. 9. As a result, in the input signal of FIG. 16, $V_r(t)$ which represents the difference ($V_L-V_{in}$) between the lower limit value $V_L$ and the input voltage $V_{in}$ in the second section T2 is smaller than that in the input signal waveform of FIG. 9.

In this way, the signal strength $V_r(t)$ changes as the duty ratio of the input signal changes. The signal strength $V_r(t)$ determines the amplitude of the waveform to be inserted in the second section T2 by the waveform generating unit 10. The waveform generating unit 10 brings the DC level of the input signal closer to the lower limit value $V_L$ by inserting in the second section T2 the waveform defined by the signal strength $V_r(t)$. That is, the waveform generating unit 10 changes the signal strength $V_r(t)$ in accordance with the change of the DC level of the input signal that changes with the duty ratio of the input signal waveform.

Figure 17A:
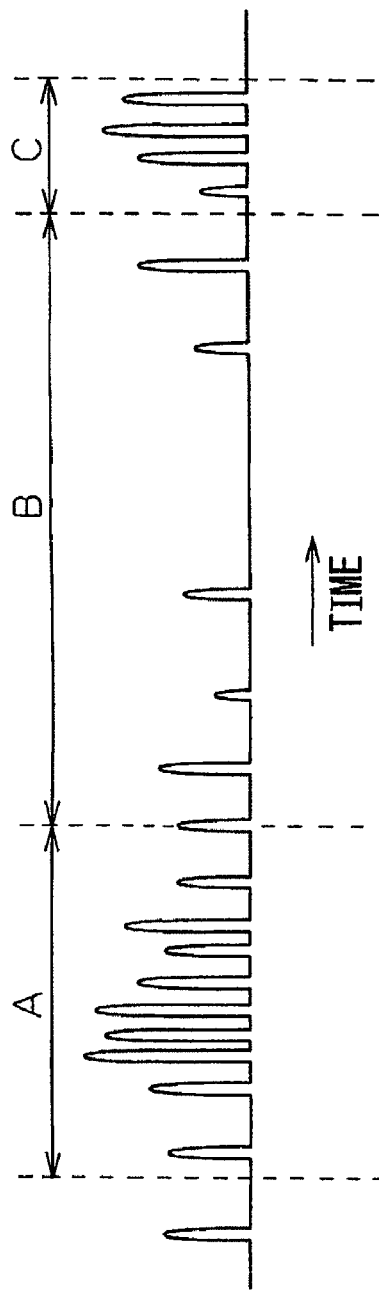
FIG. 17A is an explanatory diagram of the waveform of the input signal.
Figure 17B:
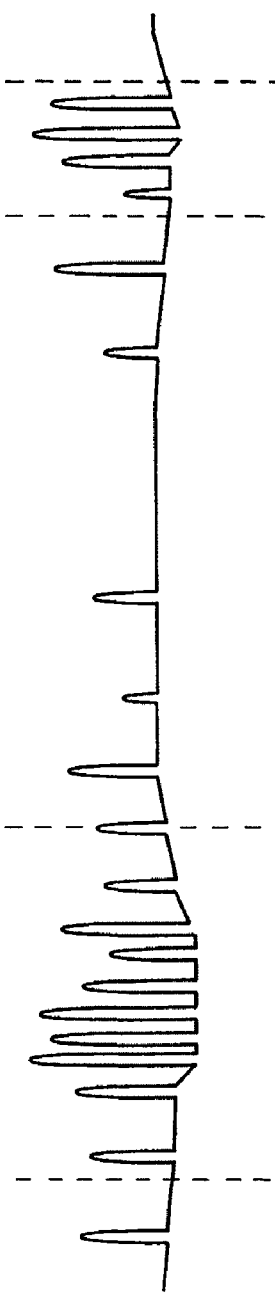
FIG. 17B is an explanatory diagram of the waveform of the input signal after the DC component of the input signal of FIG. 17A has been removed.

A change in the DC level of the input signal causes a change in the signal strength of the waveform passed through the DC component removing capacitor C1 in FIG. 5. FIG. 17A is an explanatory diagram of the waveform of the input signal, and FIG. 17B is an explanatory diagram of the waveform after the DC component of the signal of FIG. 17A has been removed. When the duty ratio increases in section A or C, the DC level increases, and the amount by which the signal strength of the DC-removed signal drops thus increases. When the duty ratio decreases in section B, the DC level decreases, and the amount by which the signal strength of the DC-removed signal drops thus decreases.

Figure 17C:
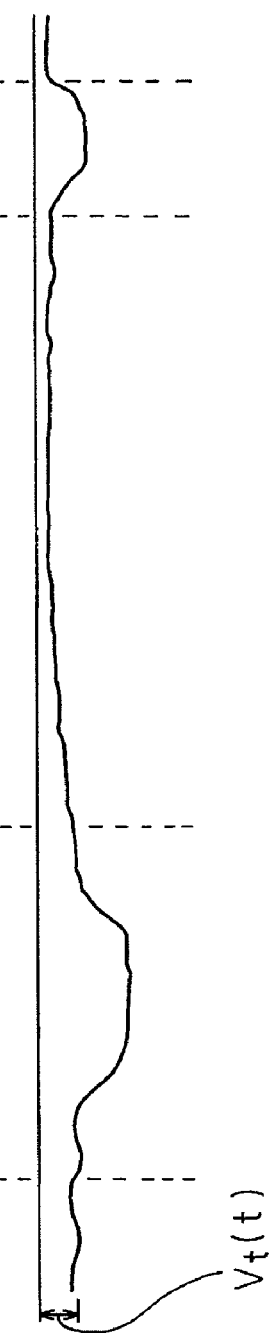
FIG. 17C is an explanatory diagram of the signal strength $V_t$.

It is desirable that the signal strength $V_r(t)$ change in such a manner as to compensate for the change in the signal strength of the DC-removed signal that changes with the duty ratio. FIG. 17C illustrates the signal strength $V_r(t)$ that is changing in such a manner as to compensate for the change in the signal strength of the DC-removed signal of FIG. 17B.

The reason that the signal strength of the DC-removed signal changes with the duty ratio is that the low-frequency components of the input signal are removed by a high-pass filter formed from the capacitor C1 and resistor R1 in FIG. 5. Accordingly, by configuring the waveform modifying unit 10 to modify the input signal in such a manner as to cancel out the low-frequency components expected to be removed by the high-pass filter, the signal strength of the waveform can be prevented from dropping when passed through the DC component removing capacitor C1.

More specifically, it is desirable that the time constant that determines the speed with which the signal strength $V_r(t)$ responds to a change in the duty ratio of the input signal waveform be set so as to cancel out the low-frequency components expected to be removed by the high-pass filter. The low-frequency components removed by the high-pass filter are the components having frequencies lower than the cutoff frequency $fc=(1/(2\times\pi\times R1\times C1))$ of the high-pass filter. It is therefore desirable that the response speed of the signal strength $V_r(t)$, i.e., the time constant, be set so that the low-frequency components lower than the cutoff frequency fc are canceled out in advance from the input signal by the response of the signal strength $V_r(t)$. The response speed of the signal strength $V_r(t)$ can be set by adjusting the length of the integration period $T_s$ and the averaging interval n of the moving average operation performed by the smoothing units 34 to 36 or 44 and 45.

Figure 18:
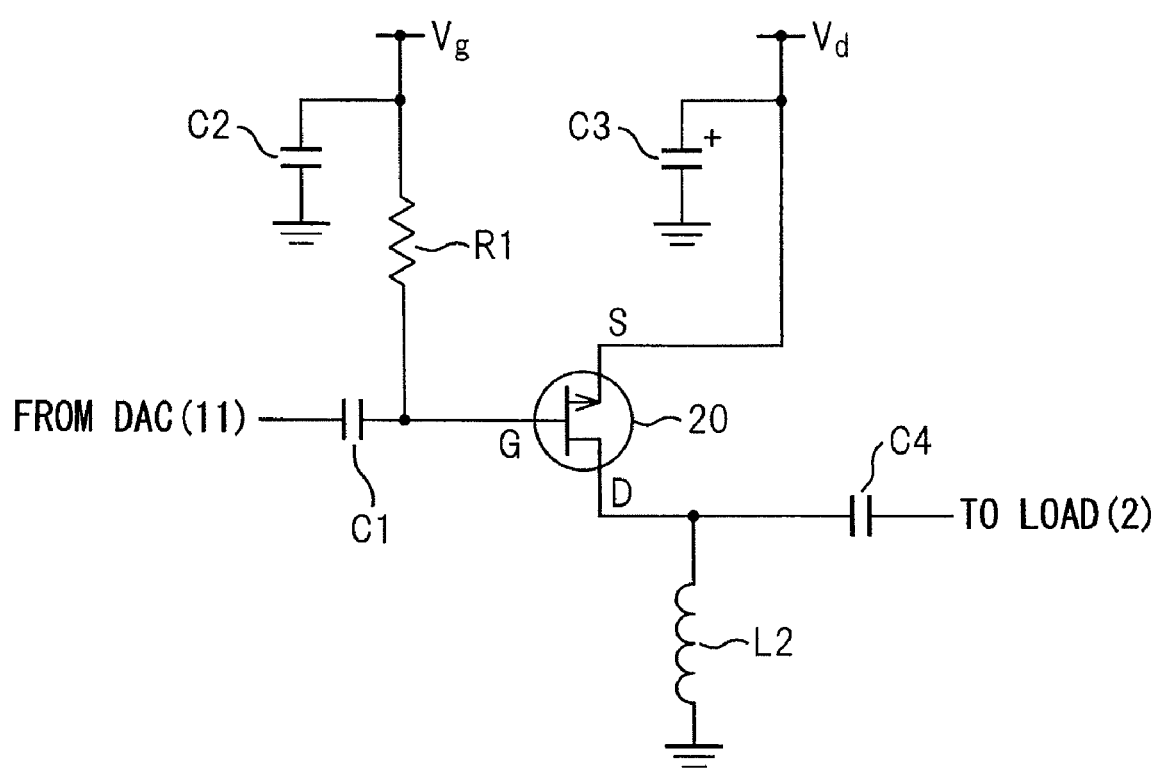
FIG. 18 is an explanatory diagram illustrating a second configuration example of the amplifying unit.

In the above configuration example, the amplifying unit 13 includes a source grounding circuit for the FET 20 which is used as the amplifying device. Alternatively, the amplifying unit 13 may include a drain grounding circuit for the FET 20. FIG. 18 is an explanatory diagram illustrating a second configuration example of the amplifying unit 13. Reference numeral 20 indicates an n-channel FET, R1 indicates a resistor, C1 to C4 indicate capacitors, and L2 indicates an inductor.

The output signal from the DAC 11 is first passed through the DC component removing capacitor C1 and then summed with a gate bias voltage, and the resulting signal is applied to the gate terminal of the FET 20. The gate bias voltage is supplied from a power supply line that supplies predetermined voltage $V_g$ via the resistor R1; this power supply line is grounded via the capacitor C2.

The source terminal of the FET 20 is connected to a power supply line that supplies voltage $V_d$. This power supply line is grounded via the capacitor C3. The drain terminal of the FET 20 is grounded via the inductor L2, and the output signal from the drain terminal is supplied to the load 2 via the DC component removing capacitor C4.

The above description has been given by taking as an example the amplifying circuit that uses an FET as the amplifying device. It will, however, be appreciated that the device and method disclosed herein can be applied extensively to any class B amplifying circuit. Therefore, the scope of the device and method disclosed herein is not limited to amplifying circuits that use FETs. The scope of the device and method disclosed herein includes any class B amplifying circuit whose bias is adjusted in accordance with the above configuration and method. For example, a bipolar transistor may be used as the amplifying device.

Figure 19:
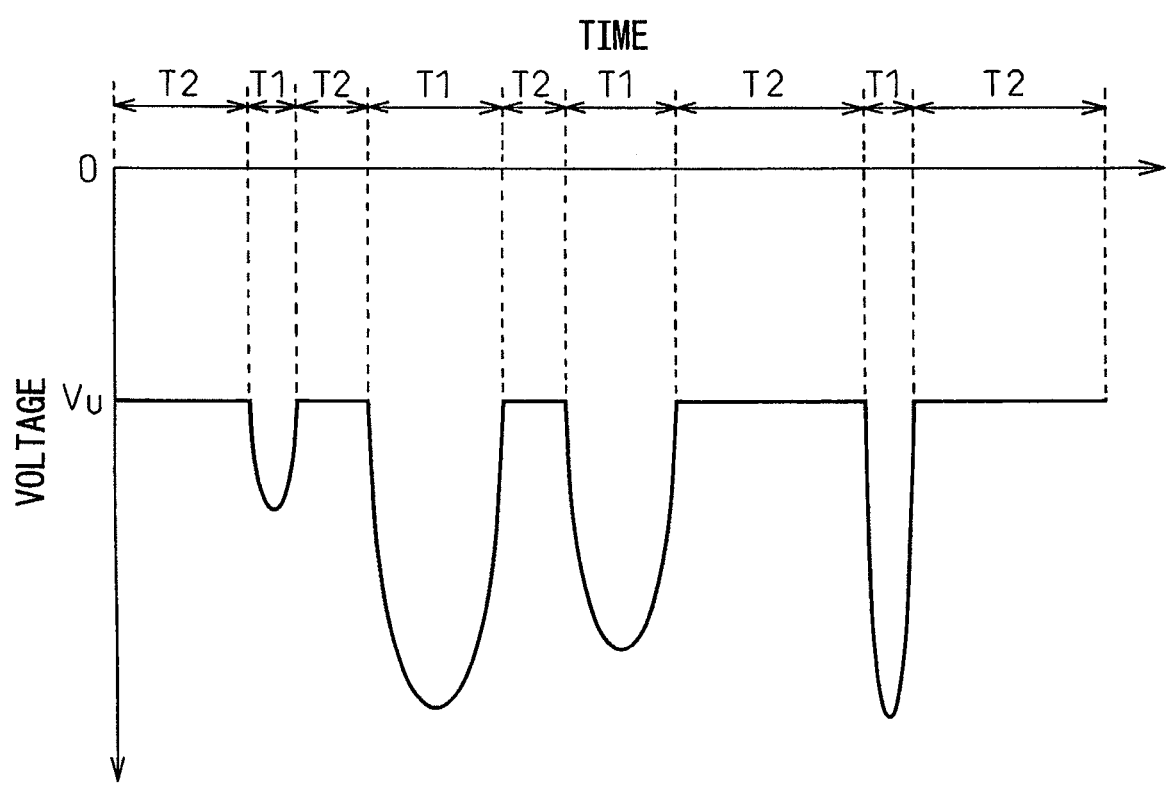
FIG. 19 is an explanatory diagram illustrating the waveform of a second example of the input signal.

FIG. 19 is an explanatory diagram illustrating the waveform of a second example of the input signal. The input signal waveform alternates repeatedly between a first section T1 where there is a waveform to be amplified and a second section T2 where there is not. In the first section T1, the signal value varies within a range limited by an upper limit value $V_U$. In the input signal example illustrated here, the waveform has a shape similar to that of a half-wave and, during the second section T2, the signal remains unchanged with its signal value maintained substantially at the upper limit value $V_U$.

The amplifying circuit 1 depicted in FIG. 4 may be used to amplify the input signal illustrated in FIG. 19. In this case, the integrating unit 30 or the first integrating unit 40 calculates the integrated value $S_p$ by integrating the difference ($V_U$-$V_{in}$) between the upper limit value $V_U$ and the input voltage $V_{in}$ over the first section T1 in each integration period $T_s$. Here, if the input signal remains unchanged with its signal value maintained substantially at the upper limit value $V_U$ throughout the second section T2, the integrating unit 30 may calculate the integrated value $S_p$ by integrating the difference ($V_{in}$-$V_U$) between the input voltage $V_{in}$ and the upper limit value $V_U$ over the entire integration period $T_s$.

Further, the second integrating unit 41 calculates the integrated value $S_n$ by integrating the difference ($V_r(t-1)$-$V_U$) between the upper limit value $V_U$ and the input voltage $V_r(t-1)$ over the second section T2 in each integration period $T_s$. The waveform generating unit 33 generates the waveform of the input signal in the second section T2 so that the signal value in the second section T2 becomes equal to ($V_r(t)$-$V_U$).

Figure 20:
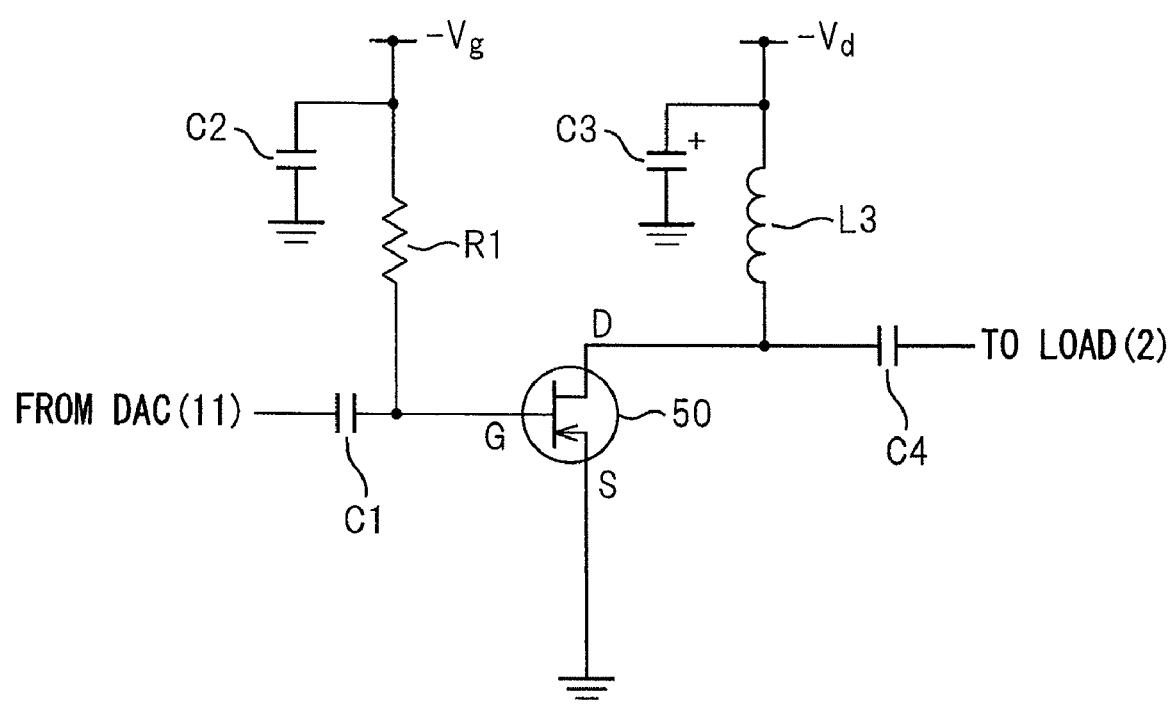
FIG. 20 is an explanatory diagram illustrating a second configuration example of the amplifying unit.

To amplify the waveform in the first section T1 illustrated in FIG. 19, the amplifying unit 13 is configured as illustrated in FIG. 20. Reference numeral 50 indicates a p-channel FET, R1 indicates a resistor, C1 to C4 indicate capacitors, and L3 indicates an inductor.

The amplifying unit 13 includes a source grounding circuit for the FET 50 which is used as the amplifying device. The output signal from the DAC 11 is first passed through the DC component removing capacitor C1 and then summed with a gate bias voltage, and the resulting signal is applied to the gate terminal of the FET 50. The gate bias voltage is supplied from a power supply line that supplies predetermined negative voltage -$V_g$ via the resistor R1; this power supply line is grounded via the capacitor C2.

The drain terminal of the FET 50 is coupled via the inductor L3 to a power supply line that supplies negative voltage -$V_d$. This power supply line is grounded via the capacitor C3. The drain terminal of the FET 50 is connected to the load 2 via the DC component removing capacitor C4, and the FET 50 amplifies the input signal supplied from the DAC 11 and applies the resulting amplified signal to the load 2.

Figure 21A:
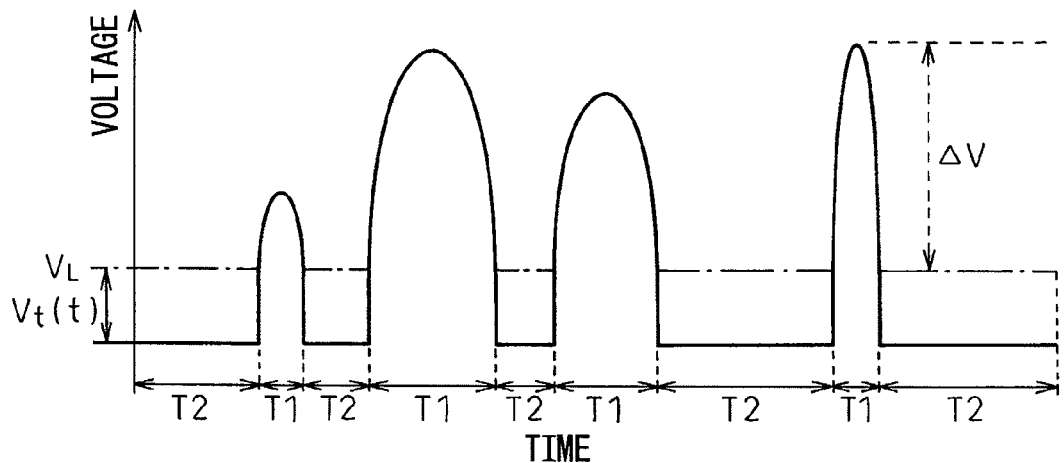
FIGS. 21A to 21C are explanatory diagrams illustrating examples of the output signal of the waveform modifying unit.
Figure 21B:
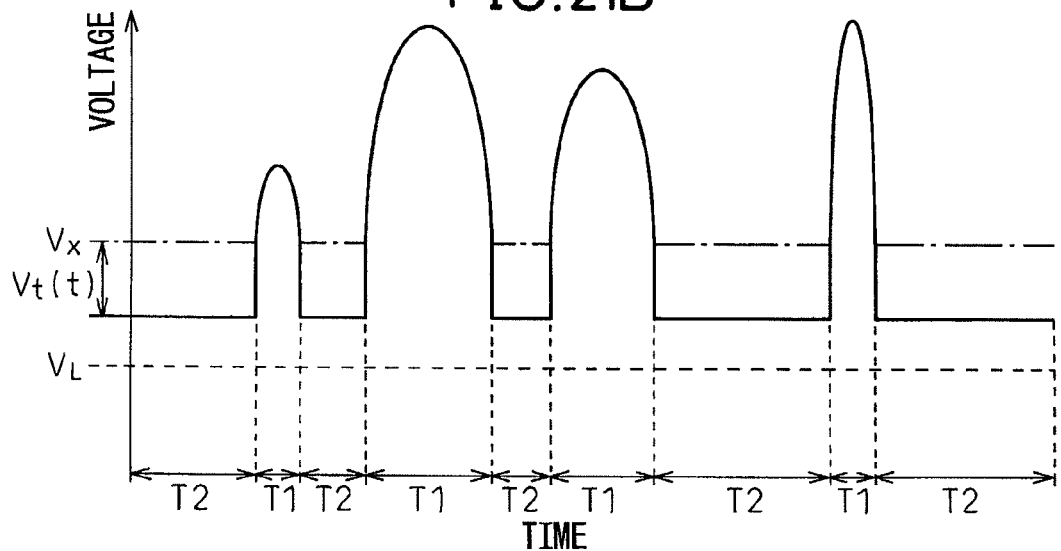
Figure 21C:
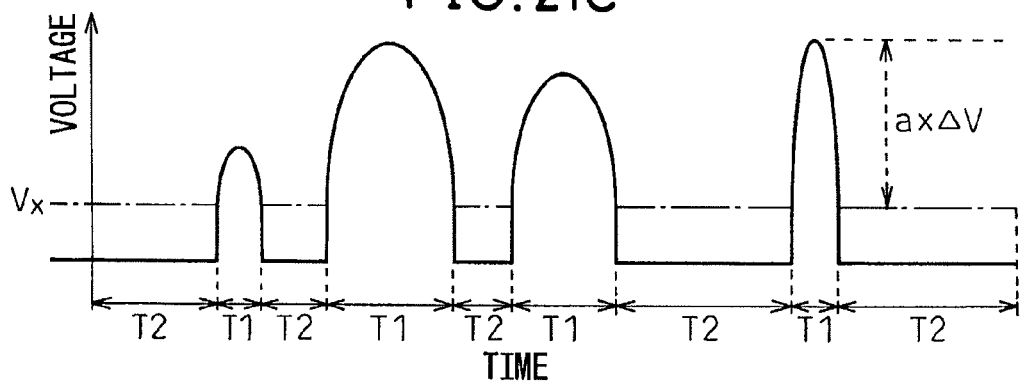

FIGS. 21A to 21C are explanatory diagrams illustrating examples of the output signal of the waveform modifying unit 10. As illustrated in FIG. 21A, the lower limit value $V_L$ of the variation range of the signal value in the first section T1 before the input signal is modified by the waveform modifying unit 10 and the lower limit value $V_L$ of the variation range of the signal value in the first section T1 after the signal is modified may be made equal to each other.

In an alternative example, the lower limit value $V_X$ of the variation range of the signal value in the first section T1 after the input signal is modified by the waveform modifying unit 10 may not be made equal to the lower limit value $V_L$ of the variation range of the signal value in the first section T1 before the signal is modified. Such an example of the output signal of the waveform modifying unit 10 is depicted in FIG. 21B. The waveform modifying unit 10 modifies the waveform of the input signal in such a manner as to bring the DC level of the input signal closer to the lower limit value $V_X$ of the variation range of the signal value in the first section T1 after the input signal is modified by the waveform modifying unit 10. Such a waveform modifying unit 10 may be implemented by placing an adder that adds a predetermined constant directly after the waveform generating unit 33.

Further, the amplitude (a×$\Delta V$) of the signal value in the first section T1 after the input signal is modified by the waveform modifying unit 10 may not be made equal to the amplitude $\Delta V$ of the signal value in the first section T1 before the signal is modified. Such an example of the output signal of the waveform modifying unit 10 is depicted in FIG. 21C. In this case also, the waveform modifying unit 10 modifies the waveform of the input signal in such a manner as to bring the DC level of the input signal closer to the lower limit value $V_X$ of the variation range of the signal value in the first section T1 after the input signal is modified by the waveform modifying unit 10. Such a waveform modifying unit 10 may be implemented by placing directly after the waveform generating unit 33 a multiplier that multiplies a predetermined constant.

Figure 22:
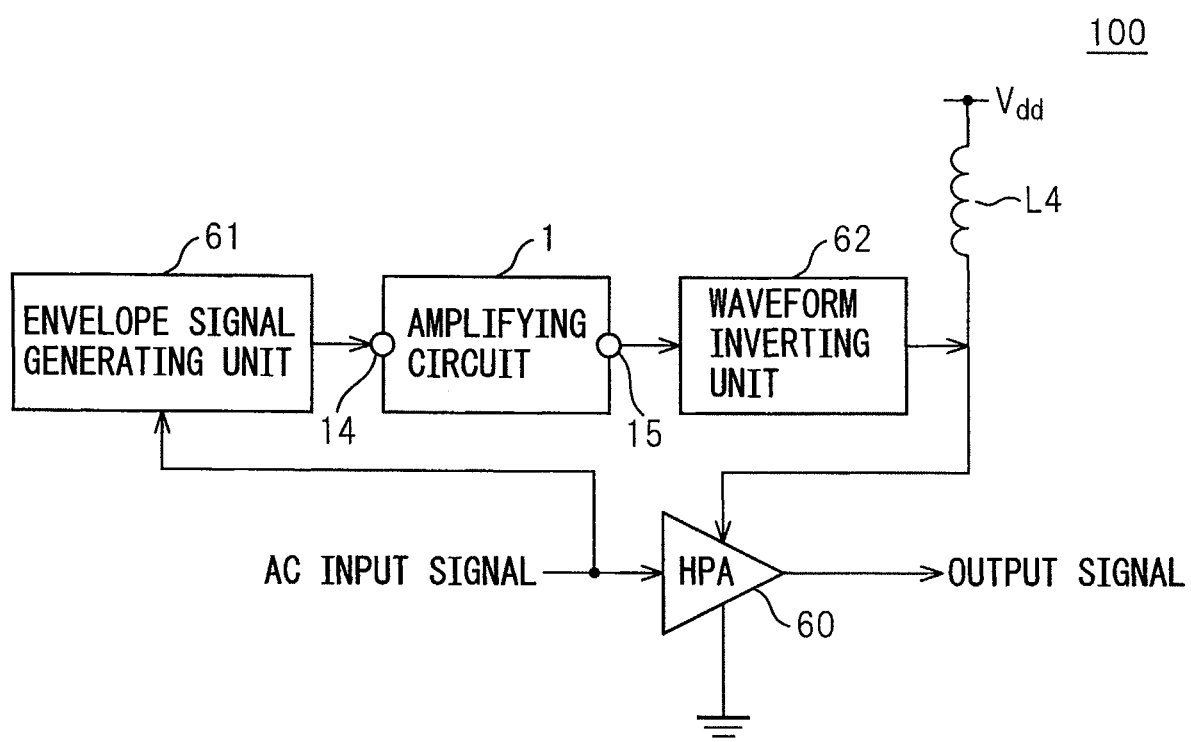
FIG. 22 is an explanatory diagram illustrating a configuration example of an AC signal amplifying circuit according to the present disclosure.

FIG. 22 is an explanatory diagram illustrating a configuration example of an AC signal amplifying circuit 100 according to the present disclosure. The AC signal amplifying circuit 100 is a circuit for amplifying an AC input signal which is an AC signal in the microwave region. Reference numeral 1 indicates the amplifying circuit described with reference to FIG. 4, 60 indicates a high-power amplifier (HPA), 61 indicates an envelope signal generating unit, 62 indicates a waveform inverting unit, and L4 indicates an inductor. When the amplifying unit 13 in the amplifying circuit 1 is constructed as illustrated in FIG. 18, the waveform inverting unit 62 need not be provided.

The amplifying circuit 1, the HPA 60, the envelope signal generating unit 61, the waveform inverting unit 62, and the inductor L4 together constitute the AC signal amplifying circuit 100. The HPA 60 is an amplifying device for amplifying the AC input signal in the microwave region. The envelope signal generating unit 61 generates an envelope signal that has an envelope waveform corresponding to the AC input signal supplied to the HPA 60. The envelope signal generating unit 61 supplies the generated envelope signal to the amplifying circuit 1 described with reference to FIG. 4. The envelope signal is, for example, a signal in the VHF band.

The amplifying circuit 1 amplifies the envelope signal and supplies the amplified signal to the waveform inverting unit 62. The waveform inverting unit 62 outputs a relatively small signal for a relatively large input and a relatively large signal for a relatively small input, thus generating an inverted signal by inverting the waveform of the amplified envelope signal with respect to the magnitude of the signal intensity. The inverted signal output from the waveform inverting unit 62 is added to the supply voltage $V_{dd}$ that is being supplied from the power supply line via the inductor L4. The supply voltage with the inverted signal added thereto is supplied as power to the HPA 60.

With the above configuration, the HPA 60 is supplied with a large supply voltage during a period when the amplitude of the envelope of the AC input signal is large and with a small supply voltage during a period when the amplitude of the envelope of the AC input signal is small; this serves to reduce the power consumption of the HPA 60.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An amplifying circuit for amplifying an input signal having a waveform that alternates repeatedly between a first section where a signal value varies within a variation range limited by at least one of upper and lower limit values and a second section that is a section other than the first section, comprising:
    a waveform modifying unit which changes the signal value in the second section in such a manner as to reduce a difference between the signal strength of a DC component of the input signal and the limit value that limits the variation range of the signal value in the first section;
    a DC component removing unit which removes the DC component of the input signal after the input signal has been modified by the waveform modifying unit; and
    an amplifying unit which amplifies the input signal whose DC component has been removed.

2. The amplifying circuit as claimed in claim 1, wherein changing the signal value in the second section by the waveform modifying unit comprises changing the signal value in the first section thereby changing the signal value in the second section relative to the signal value in the first section.

3. The amplifying circuit as claimed in claim 1, wherein the waveform modifying unit comprises:
    a first integrating unit which integrates over a predetermined section a difference between the signal value in the first section and the limit value that limits the variation range of the signal value in the first section;
    a section length detection unit which detects section length that the second section occupies in the predetermined section; and
    a signal strength adjusting unit which adjusts the signal strength of the signal value in the second section in accordance with the section length and with the integrated value calculated by the first integrating unit.

4. The amplifying circuit as claimed in claim 1, wherein the waveform modifying unit comprises:
    a first integrating unit which integrates over a predetermined section a difference between the signal value in the first section and the limit value that limits the variation range of the signal value in the first section;
    a second integrating unit which integrates over the predetermined section a difference between the signal value in the second section and the limit value that limits the variation range of the signal value in the first section; and
    a signal strength adjusting unit which adjusts the signal strength of the signal value in the second section in such a manner as to reduce the difference between the integrated values calculated by the first and second integrating unit.

5. The amplifying circuit as claimed in claim 1, wherein the signal value of the input signal in the second section is equal to the limit value that limits the variation range of the signal value in the first section, and wherein the waveform modifying unit comprises:
    a first integrating unit which integrates over a predetermined section a difference between the input signal and the limit value that limits the variation range of the signal value in the first section;
    a section length detection unit which detects section length that the second section occupies in the predetermined section; and
    a signal strength adjusting unit which adjusts the signal strength of the signal value in the second section in accordance with the section length and with the integrated value calculated by the first integrating unit.

6. The amplifying circuit as claimed in claim 1, wherein the signal value of the input signal in the second section is equal to the limit value that limits the variation range of the signal value in the first section, and wherein the waveform modifying unit comprises:
    a first integrating unit which integrates over a predetermined section a difference between the input signal and the limit value that limits the variation range of the signal value in the first section;
    a second integrating unit which integrates over the predetermined section a difference between the signal value in the second section and the limit value that limits the variation range of the signal value in the first section; and
    a signal strength adjusting unit which adjusts the signal strength of the signal value in the second section in such a manner as to reduce the difference between the integrated values calculated by the first and second integrating unit.

7. The amplifying circuit as claimed in claim 1, further comprising a smoothing unit which smoothes any variation in the signal value in the second interval that has been changed by the waveform modifying unit.

8. The amplifying circuit as claimed in claim 1, wherein the amplifying unit is operated in class B to amplify the input signal whose DC component has been removed.

9. An amplifying circuit comprising:
- an amplifier which amplifies an AC signal;
- an envelope signal generating unit which generates an envelope signal of the AC signal, wherein the envelope signal has a waveform that alternates repeatedly between a first section where a signal value varies within a variation range limited by at least one of upper and lower limit values and a second section that is a section other than the first section;
- a waveform modifying unit which changes the signal value in the second section in such a manner as to reduce a difference between the signal strength of a DC component of the envelope signal and the limit value that limits the variation range of the signal value in the first section;
- a DC component removing unit which removes the DC component of the envelope signal after the envelope signal has been modified by the waveform modifying unit;
- an amplifying unit which amplifies the envelope signal whose DC component has been removed; and
- a supply voltage adjusting unit which adjusts a supply voltage for the amplifier in accordance with the envelope signal amplified by the amplifying unit.

10. A method for amplifying an input signal having a waveform that alternates repeatedly between a first section where a signal value varies within a variation range limited by at least one of upper and lower limit values and a second section that is a section other than the first section, the method comprising:
- changing the signal value in the second section in such a manner as to reduce a difference between the signal strength of a DC component of the input signal and the limit value that limits the variation range of the signal value in the first section;
- removing the DC component of the input signal after the signal value in the second section has been changed; and
- amplifying, using a first amplifier, the input signal whose DC component has been removed.

11. The amplifying method as claimed in claim 10, wherein the first amplifier is operated in class B to amplify the input signal whose DC component has been removed.

* * * * *